United States Patent [19]
Harshbarger et al.

[11] Patent Number: 5,268,708
[45] Date of Patent: Dec. 7, 1993

[54] LASER THERMAL PRINTER WITH AN AUTOMATIC MATERIAL SUPPLY

[75] Inventors: R. Jack Harshbarger, Fairport; William G. Fahey, Spencerport; Ronald R. Firth, Fairport; Seung-ho Baek, Pittsford; Charles D. DeBoer, Rochester, all of N.Y.

[73] Assignee: Eastman Kodak Company, Rochester, N.Y.

[21] Appl. No.: 749,228

[22] Filed: Aug. 23, 1991

[51] Int. Cl.$^5$ .............. G01D 15/24; G01D 15/26; G01D 15/34
[52] U.S. Cl. .............. 346/134; 250/317.1; 250/319; 346/76 L
[58] Field of Search .............. 346/76 L, 134, 136, 346/138; 355/312, 315, 27, 72; 271/194, 196; 250/316.1, 317.1, 318, 319; 242/55.3, 58

[56] References Cited

U.S. PATENT DOCUMENTS

| | | | |
|---|---|---|---|
| 3,578,862 | 5/1971 | Hudock et al. | 355/104 |
| 3,654,624 | 4/1972 | Becker et al. | 346/76 L X |
| 4,101,018 | 7/1978 | Sokolowski | 346/138 X |
| 4,362,805 | 12/1982 | Landsman | 346/76 L X |
| 4,723,134 | 2/1988 | Morita et al. | 346/138 |
| 4,800,275 | 1/1989 | Shimizu et al. | 250/317.1 |
| 5,053,791 | 10/1991 | Baek et al. | 346/138 |
| 5,164,742 | 11/1992 | Baek et al. | 346/76 L |
| 5,168,288 | 12/1992 | Baek et al. | 346/76 L |

Primary Examiner—A. T. Grimley
Assistant Examiner—William J. Royer
Attorney, Agent, or Firm—Robert L. Randall

[57] ABSTRACT

An imaging system having a source of light movable with respect to a writing element and projectable thereon to generate an image. A focusing system is provided for focusing a light source which generates a first beam of light of a wavelength selected to be actinic with respect to the writing element. At least a portion of the first beam of light is absorbed by the writing element, The apparatus includes a material supply to automatically supply donor sheets and receiver sheets independently to a writing platen or drum, and to selectively load and unload the donor sheets from superposition with the receiver sheet without disturbing the registration of the receiver sheet.

3 Claims, 28 Drawing Sheets

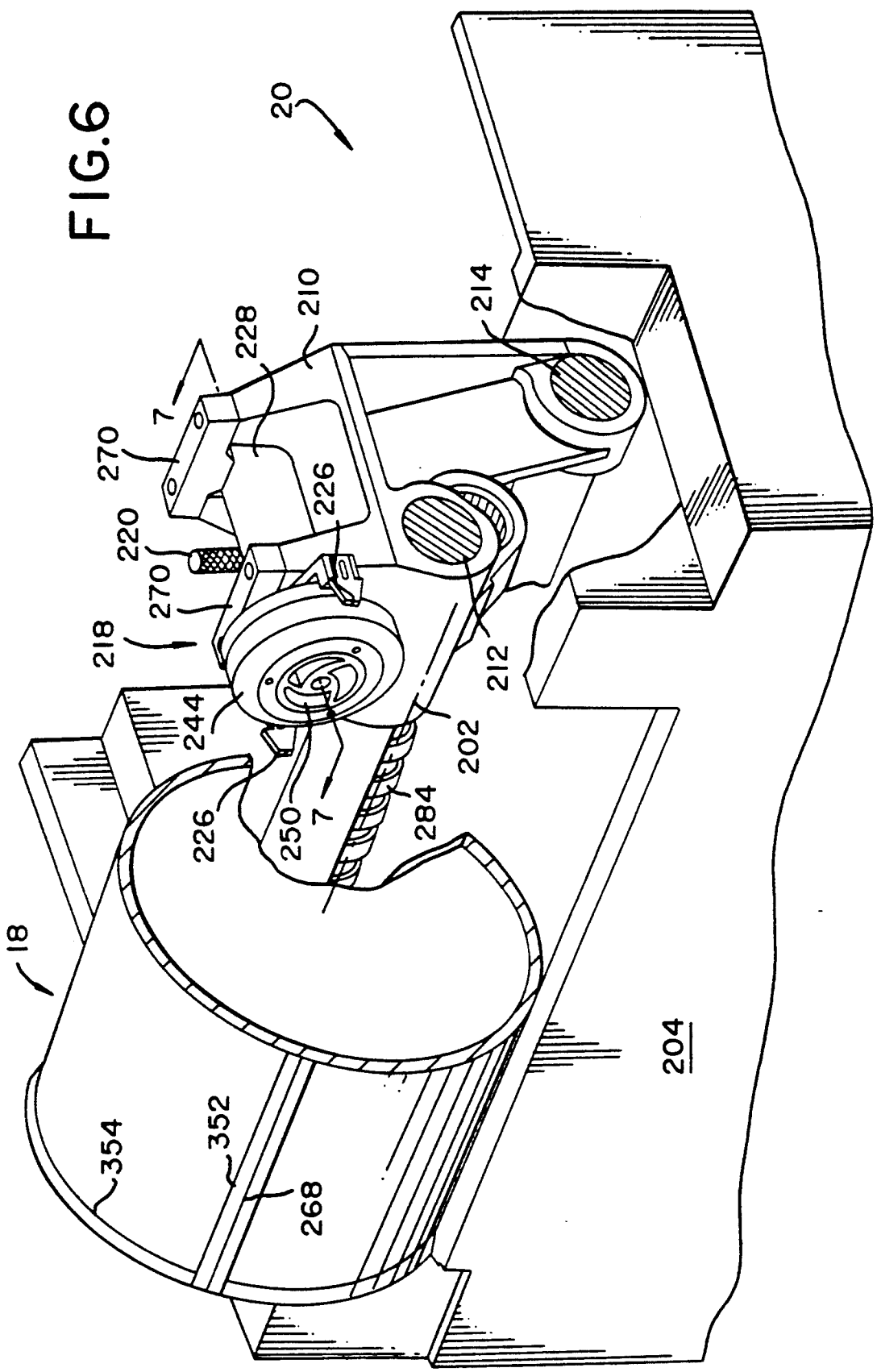

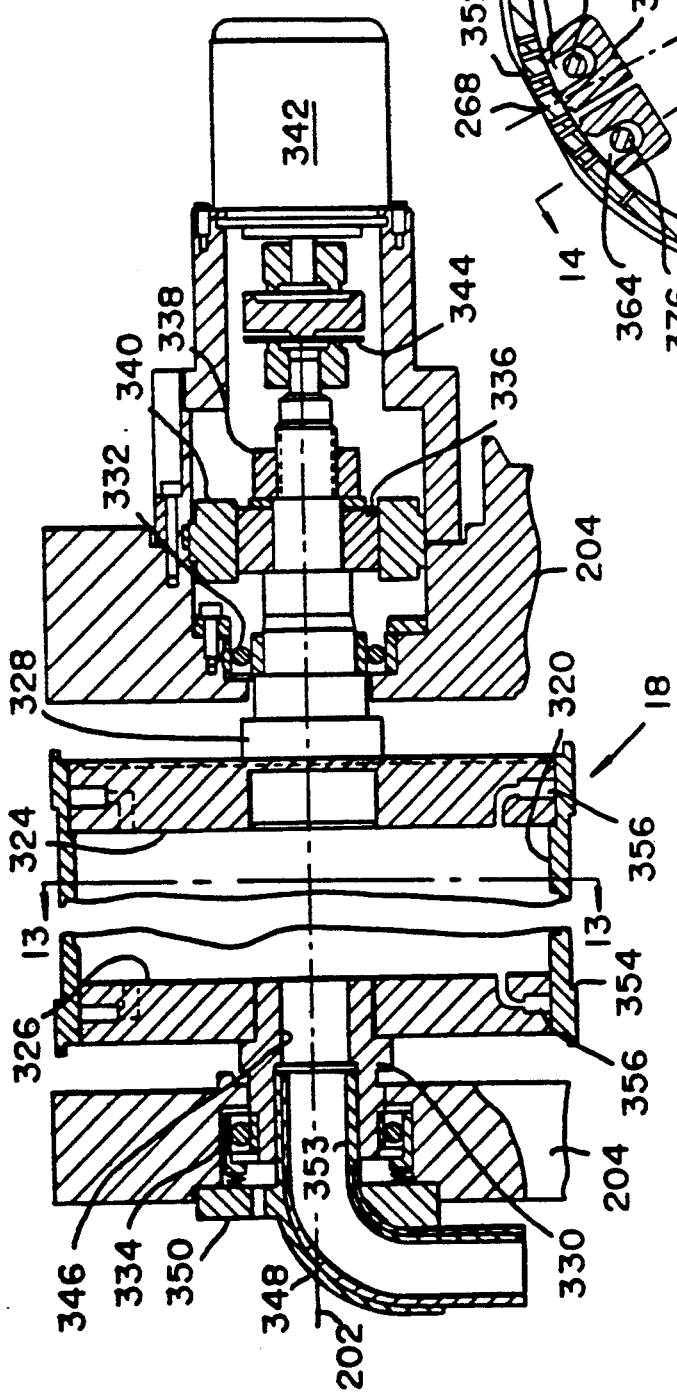

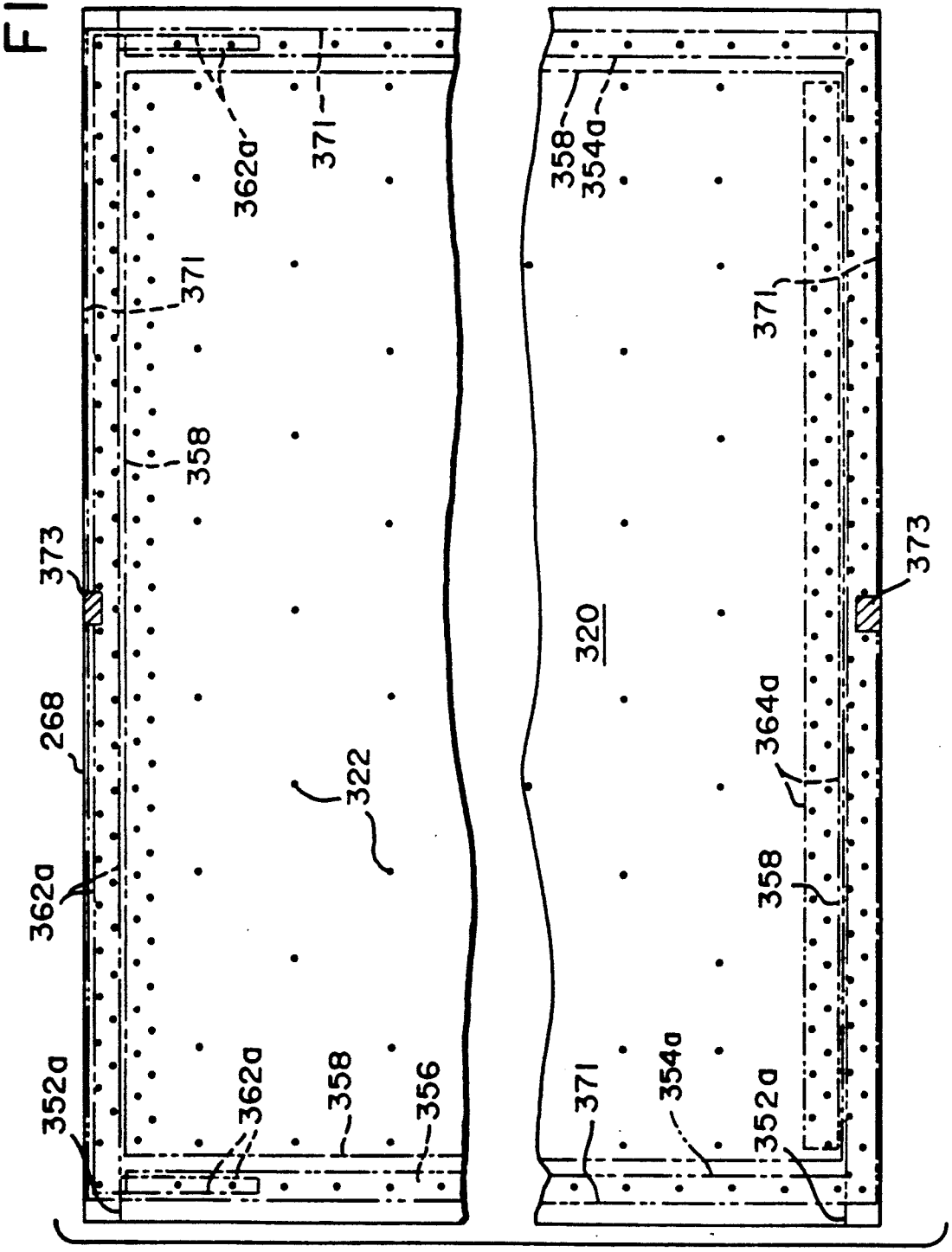

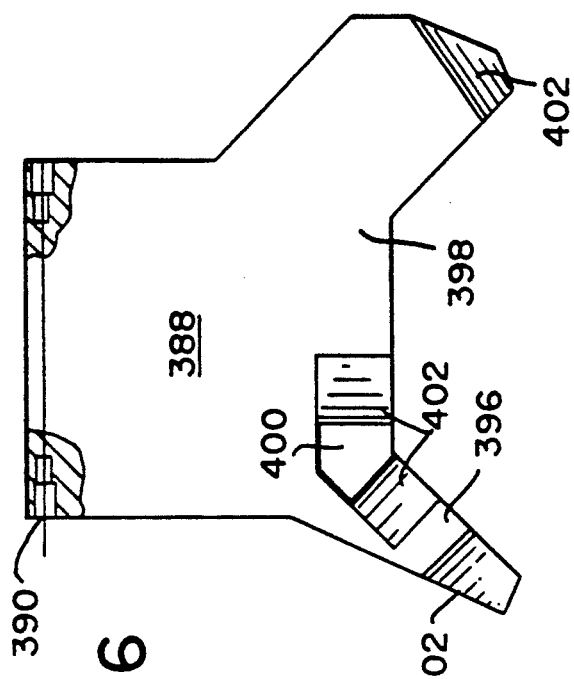
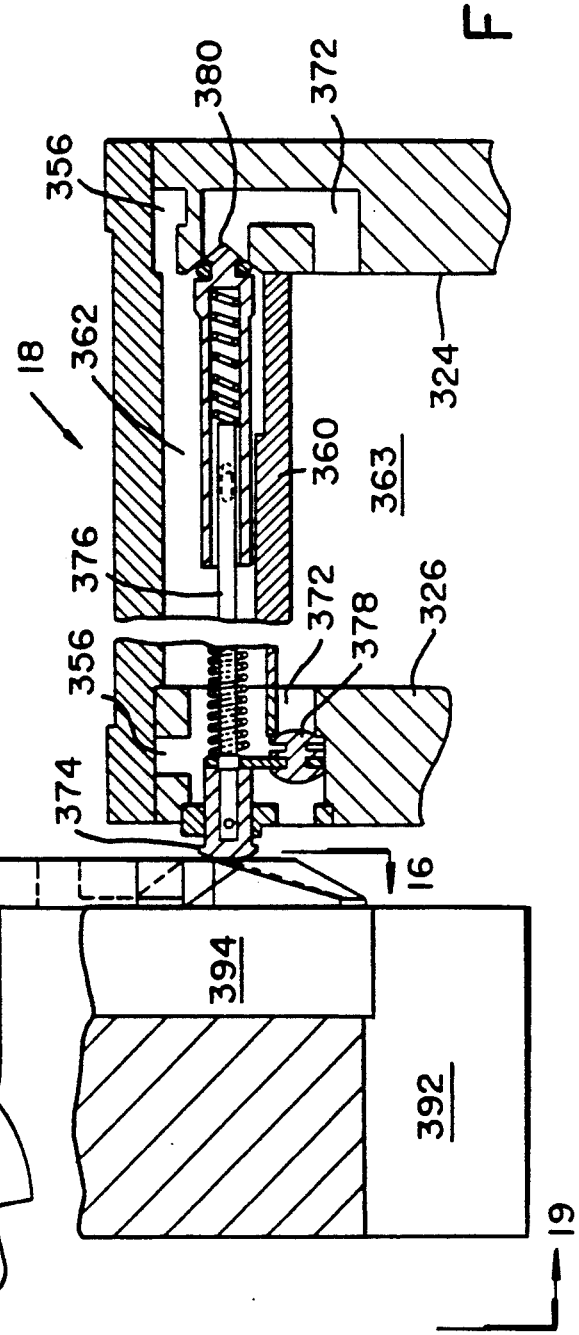
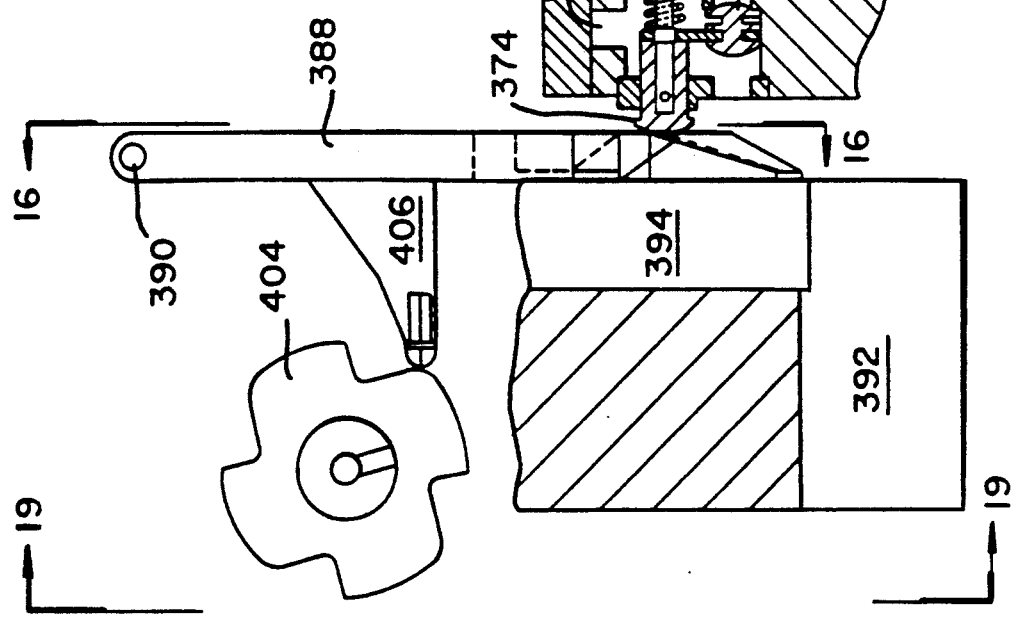

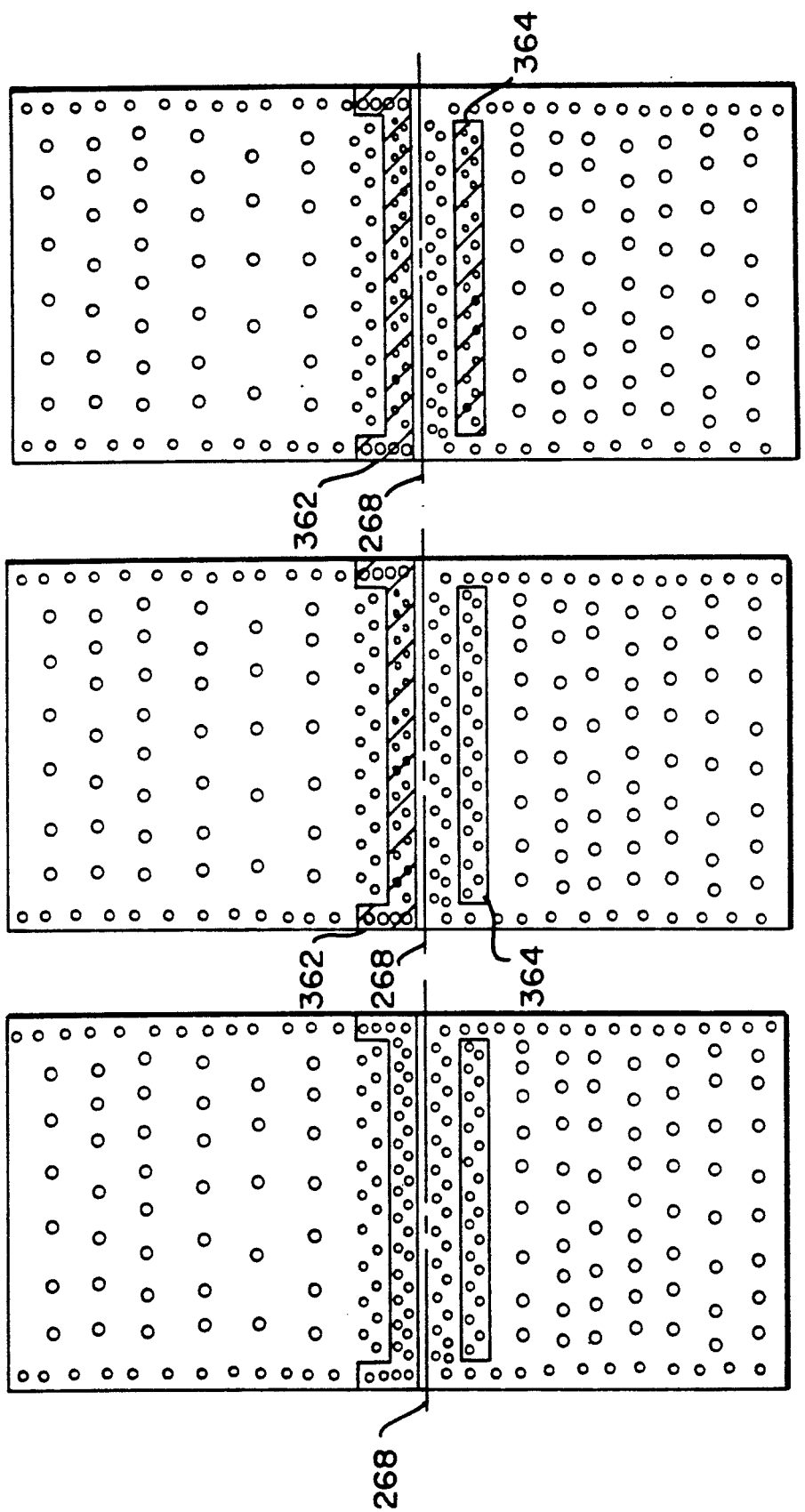

FIG. 23C

RECEIVER UNLOADING SEQUENCE

| SEQUENCE NUMBER | DRUM FLAT ℓ POSITION | DIRECTION OF ROTATION | VACUUM RECEIVER | VACUUM DONOR | LOAD ROLLER | DONOR STRIPPER BLADE |
|---|---|---|---|---|---|---|
| 31 | D | --- | VAC. | VAC. | DISENG. → | DISENG. → |
| 32 | D | --- | ATSMR. | ATSMR. | | |
| 33 | G | C.W. | ATSMR. | ATSMR. | | |
| 34 | G | --- | VAC. | VAC. | | |
| 35 | G | C.W. | VAC. | VAC. | | |
| 36 | HOME | C.C.W. | ATSMR. | ATSMR. | | |

FIG. 23

| FIG.23A |
|---|
| FIG.23B |
| FIG.23C |

LOADING SEQUENCE

| SEQUENCE NUMBER | DRUM FLAT ¢ POSITION | DIRECTION OF ROTATION | VACUUM RECEIVER | VACUUM DONOR | LOAD ROLLER |
|---|---|---|---|---|---|
| 1 | HOME | --- | ATSMR. | ATSMR. | DISENG. |
| 2 | H | C.W. | ATSMR. | ATSMR. | DISENG. |
| 3 | H | --- | ATSMR. | ATSMR. | DISENG. |
| 4 | B | C.C.W. | ATSMR. | ATSMR. | DISENG. |
| 5 | B | --- | VAC. | VAC. | DISENG. |
| 6 | B | --- | VAC. | VAC. | ENG. |
| 7 | C | C.C.W. | VAC | VAC | ENG. |
| 8 | B | C.W. | VAC. | VAC. | ENG. |
| 9 | B | --- | VAC. | VAC. | DISENG. |
| 10 | H | C.W. | VAC. | VAC. | DISENG. |
| 11 | H | --- | VAC. | ATSMR. | DISENG. |
| 12 | H | --- | VAC. | ATSMR. | DISENG. |
| 13 | H | --- | VAC. | VAC. | ENG. |
| 14 | J | --- | VAC. | VAC. | ENG. |
| 15 | H | C.C.W. | VAC. | VAC. | ENG. |
| 16 | H | C.W. | VAC. | VAC. | ENG. |
| 17 | H | --- | VAC. | VAC. | DISENG. |

FIG.23A

DONOR UNLOADING SEQUENCE

| SEQUENCE NUMBER | DRUM FLAT ¢ POSITION | DIRECTION OF ROTATION | VACUUM RECEIVER | VACUUM DONOR | LOAD ROLLER | DONOR STRIPPER BLADE |
|---|---|---|---|---|---|---|
| 21 | F | ---- | VAC. | VAC. | DISENG. | DISENG. |
| 22 | F | ---- | VAC. | VAC. | | ENG. |
| 23 | F | C.C.W. | ATSMR. | ATSMR. | | ENG. |
| 24 | E | ---- | ATSMR. | ATSMR. | | ENG. |
| 25 | E | ---- | ATSMR. | ATSMR. | | DISENG. |
| 26 | E | ---- | VAC. | VAC. | ↓ | DISENG. |
| 27 | E | C.C.W. | VAC. | VAC. | | DISENG. |

FIG. 23B

LASER THERMAL PRINTER WITH AN AUTOMATIC MATERIAL SUPPLY

RELATED APPLICATIONS

The present application is related to the following commonly assigned co-pending applications: U.S. Ser. No. 670,088, U.S. Pat. No. 5,146,242 entitled WRITING BEAM ANGULAR ALIGNMENT DEVICE; U.S. Ser. No. 670,089, U.S. Pat. No. 5,013,121 entitled AUTOMATIC CUT-OUT FOR AUTO-FOCUS DEVICE; U.S. Ser. No. 670,092, entitled WRITING BEAM FOCUSING UTILIZING LIGHT OF A DIFFERENT WAVELENGTH; U.S. Ser. No. 670,095, U.S. Pat. No. 5,196,866 entitled FOCUS FIBER MOUNT; and U.S. Ser. No. 670,129, U.S. Pat. No. 5,138,497 entitled HIGH SPEED FOCUSING LENS ASSEMBLY, all filed on Mar. 15,1991; and U.S. Ser. No. 749,378, entitled SELECTIVELY WOUND MATERIAL FOR A LASER THERMAL PRINTER, in the name of Michael H. Parsons; U.S. Ser. No. 749,223, entitled MATERIAL SUPPLY CAROUSEL, in the names of James L. Mohnkern, Michael H. Parsons, and Rene L. Gobeyn; U.S. Ser. No. 749,050, entitled MATERIAL TRANSPORT UTILIZING A MOVABLE EDGE GUIDE, in the name of Michael H. Parsons; U.S. Ser. No. 749,372, entitled LASER THERMAL PRINTER WITH A VERTICAL MATERIAL TRANSPORT, in the name of Michael H. Parsons; U.S. Ser. No. 749,224, entitled MATERIAL, TRANSPORT THAT SELECTIVELY CONTACTS DIFFERENT MATERIALS, in the names of Michael H. Parsons and William J. Simmons; U.S. Ser. No. 749,399, entitled MULTI-CHAMBERED IMAGING DRUM, in the name of Roger S. Kerr; U.S. Ser. No. 749,232, entitled METHOD AND APPARATUS FOR SELECTIVELY SORTING IMAGE-BEARING SHEETS FROM SCRAP SHEETS, in the names of Bradley C. DeCook, Roger S. Kerr and Richard L. O'Toole; U.S. Ser. No. 749,391, entitled VACUUM IMAGING DRUM WITH A MATERIAL RECEIVING RECESS IN THE PERIPHERY THEREOF, in the name of Roger S. Kerr; U.S. Ser. No. 749,231, entitled METHOD OF REMOVING AIR FROM BETWEEN SUPERPOSED SHEETS, in the names of Bradley C. DeCook, Roger S. Kerr and Richard L. O'Toole; U.S. Ser. No. 749,389, entitled VACUUM IMAGING DRUM WITH AN AXIAL FLAT IN THE PERIPHERY THEREOF, in the name of Roger S. Kerr; U.S. Ser. No. 749,230, entitled METHOD AND APPARATUS FOR LOADING AND UNLOADING SUPERPOSED SHEETS ON A VACUUM DRUM, in the names of Roger S. Kerr and James K. Lucey; U.S. Ser. No. 749,227, entitled LASER THERMAL PRINTER WITH POSITIVE AIR FLOW, in the names of Roger S. Kerr and Douglass L. Blanding; U.S. Ser. No. 749,226, entitled AUTO-FOCUS DETECTOR MASK, in the name of Michael S. Ferschl; U.S. Ser. No. 749,225, entitled INITIAL SET-UP PROCEDURE FOR AN AUTO-FOCUS LENS, in the name of Michael S. Ferschl; U.S. Ser. No. 729,222, entitled FOCUSING LASER DIODE MOUNT ON A WRITE HEAD, in the names of Michael S. Ferschl and Erich Zielinski; U.S. Ser. No. 749,386, entitled OPTICAL FIBER MOUNT AND SUPPORT, in the names of Roger S. Kerr and Stanley J. Thomas; U.S. Ser. No. 749,387, entitled REGISTRATION INDICIA ON A DRUM PERIPHERY, in the names of Cheryl J. Kuberka, David F. Dalfonso and Ensley E. Townsend; U.S. Ser. No. 749,382, entitled PRECISION LEAD SCREW DRIVE ASSEMBLY, in the name of Erich Zielinski; U.S. Ser. No. 749,390, entitled OPTICAL FIBER TAKE-UP ASSEMBLY, in the name of Erich Zielinski; U.S. Ser. No. 749,383, entitled WRITING TRANSLATOR MOUNT, in the name of Erich Zielinski; and U.S. Ser. No. 749,396, entitled HIGH APERTURE FINITE CONJUGATE LENS SYSTEM SUITABLE FOR USE AS A MICRO RELAY LENS, in the name of Donald DeJager, all filed simultaneously herewith.

BACKGROUND OF THE INVENTION

1. Field of the Invention

The present invention relates to a color proofing apparatus which utilizes an electronic signal input, and more particularly, to a method and apparatus for automatically producing full-color proof images using lasers to provide thermal energy to a series of color dye-donors to selectively transfer each dye in registration to a receiver to form a proof image.

2. Description of the Prior Art

Color-proofing is the procedure used by the printing industry for creating representative images that replicate the appearance of printed images without the cost and time required to actually set up a high-speed, high-volume printing press to print an example of the images intended. In the past, these representative images, or proofs, have been generated from the same color-separations used to produce the individual color printing plates used in printing presses so that variations in the resulting images can be minimized. Various color-proofing systems have been devised to create the proofs and have included the use of smaller, slower presses as well as means other than presses, such as photographic, electrophotographic, and non-photographic processes.

The proofs generated are judged for composition, screening, resolution, color, editing, and other visual content. The closer the proof replicates the final image produced on the printing press, as well as the consistency from image to image, from press to press, and from shop to shop, the better the acceptance of the proofing system by the printing industry. Other considerations used in judging proofing systems include reproducibility, cost of the system as well as cost of the individual proofs, speed, and freedom from environmental problems. Further, since nearly all printing presses utilize the half-tone process for forming pictorial images, wherein the original image is screened, i.e. photographed through a screen to produce one or more printing plates containing an image formed of a plurality of fine dots that simulate the varying density of the original image, proofing processes that employ the half-tone process to form the proof image have been better accepted by the printing industry than have continuous tone systems.

With the advent of electronic systems for the generation of printing plates from electronic data stored in appropriate data storage devices in the form of electronically separated single color separations, the use of photographic color separations for generating proof images has become somewhat archaic, and a variety of processes have been developed and implemented to electronically form, store, and manipulate images both for generating the actual printing plates as well as for generating the proof images. While some of these electronic systems can handle and produce analog images, the most widely used systems employ digital processes because of the ease of manipulation of such digital images. In each of these electronic processes it is possible to display the resulting image on a CRT display, but it is generally necessary to produce a "hard copy" (i.e. an image actually formed on a sheet of paper or other material) before it can be fully assessed for approval of the final printing operation. Thus, each of these electronic systems requires the use of some form of output device or printer which can produce a hard copy of the image for actual evaluation. It is to the field of proofing output devices that the present invention is directed.

While purely photographic processes can provide accurate reproductions of images, they do not always replicate the reproduction resulting from printing presses. Further, most photographic processes do not produce half-tone images that can be directly compared to the printed images they are intended to emulate. Moreover, they are almost universally incapable of reproducing the images on the wide variety of paper or other material that can be run through a printing press. It is known that the appearance of the final printed image is affected by the characteristics of the paper or other material upon which it is printed. Thus, the ability to form the proof image on the material actually to be used in the press can be a determining factor in the market success of the proofing system.

Other continuous tone proofing systems, such a thermal processes and ink-jet systems have been developed, but they do not replicate the half-tone images so desired by the printing industry.

Electrophotographic proofing systems with half-tone capability have been introduced which employ either wet or dry processes. The electrophotographic systems that use dry processes suffer from the lack of high resolution necessary for better quality proofing, particularly when the images are of almost continuous tone quality. This results from the fact that dry electrophotographic processes do not employ toner particles which have a sufficiently small size to provide the requisite high image resolution. While wet electrophotographic processes do employ toners with the requisite small particle size, they have other disadvantages such as the use of solvents that are environmentally undesirable.

In commonly assigned U.S. patent application Ser. Nos. 451,655, U.S. Pat. No. 5,164,742 issued Nov. 17, 1992 and 451,656, U.S. Pat. No. 5,168,288 issued Dec. 1, 1992; both filed Dec. 18, 1989, a thermal printer is disclosed which may be adapted for use as a direct digital color proofer with half-tone capabilities. This printer is arranged to form an image on a thermal print medium, or writing element, in which a donor element transfers a dye to a receiver element upon receipt of a sufficient amount of thermal energy. This printer includes a plurality of diode lasers which can be individually modulated to supply energy to selected areas of the medium in accordance with an information signal. The print-head of the printer includes one end of a fiber optic array having a plurality of optical fibers coupled to the diode lasers. The thermal print medium is supported on a rotatable drum, and the print-head with the fiber optic array is movable relative to the drum. The dye is transferred the receiver element as the radiation, transferred from the diode lasers to the donor element by the optical fibers, is converted to thermal energy in the donor element.

A direct digital color proofer utilizing a thermal printer such as that just described must be capable of consistently and accurately writing minipixels at a rate of 1800 dots per inch (dpi) and higher to generate half-tone proofs having a resolution of 150 lines per inch and above, as is necessary to adequately proof high quality graphic arts images such as those found in high quality magazines and advertisements. Moreover, it is necessary to hold each dot or minipixel to a density tolerance of better than 0.1 density unit from that prescribed in order to avoid visible differences between the original and the proof. This density control must be repeatable from image-to-image and from machine-to-machine. Moreover, this density control must also be maintained in each of the colors being employed in multiple passes through the proofer to generate a full color image.

Aspects of the apparatus which affect the density of the dots that make up the image include such things as variations and randomness of the intensity and frequency of the laser output, and variations in the output of the fiber optics which can vary from fiber to fiber and even within a single fiber as it is moved during the writing process. Variations in the finish of the drum surface as well as drum runout and drum bearing runout and variations in the parallelism of the translation of the print-head with respect to the axis of the drum also affect the density of the image dots. Any uneven movement of the imaging drum or of the writehead translation during the writing process, or anything which imparts jitter to any part of the imaging apparatus can adversely impact the quality of the finished image and its value as a representative proof. The difference in the distance between the ends of individual fibers and the drum surface also affects image density because of the fact that the end of the fiber bundle is flat while the surface of the drum is curved. Temperature variations in the print-head due to the ambient temperature of the machine as well as the fact that the writing process itself heats the print-head also influence the image density.

Variations in the print medium elements, such as variations in the thickness of the donor and receiver elements as well as the various layers that are a part thereof, can also affect the image density as it is being written.

Thus, it has been found necessary to provide a writing apparatus which meets all of the foregoing requirements and yet which is substantially automated to improve the control, quality and productivity of the proofing process while minimizing the attendance and labor necessary. Moreover, the writing apparatus must be capable of not only generating this high quality image consistently, but it must be capable of creating a multi-color image which is in registration regardless of how the various individual images are supplied to the element comprising the final image. That means, in a thermal proofing process such as that described above, that various donor material sheets must be sequentially superposed with a single receiver sheet and then removed without disturbing the receiver sheet on the writing drum or platen, since maintaining the receiver sheet in one position during the entire writing process is what assures the necessary registration of the multiple superposed images that create the final proof.

Thus it will be seen that a method and apparatus for constantly, quickly and accurately generating an image utilizing such a thermal imaging process to create high quality, accurate, and consistant proof images would be

SUMMARY OF THE INVENTION

According to one embodiment of the present invention, in a thermal imaging apparatus is provided which comprises a support member arranged to mount a receiver member and a donor member in superposed relationship thereon. Means is provided for generating a modulated coherent light beam and for projecting the light beam onto the donor member mounted on the support member to transfer an image onto the receiver member by transferring a dye from the donor member. Means is provided for moving the light beam relative to the donor member on the support member. Supply means is provided for selectively supplying a sheet of a receiver material and a sheet of a donor material to the support member. The support member is provided with sheet holding means in the surface thereof for adhering a receiver sheet and a donor sheet to the support member in superposed relation. First means is provided for selectively removing the donor sheet from superposition with the receiver sheet on the support member, and second means is provided for selectively removing the receiver sheet containing an image from the support member.

According to another embodiment of the present invention a thermal imaging apparatus comprises an imaging drum member mounted for rotation about its axis and arranged to mount a receiver member and a donor member in superposed relationship thereon. Means is provided for generating a modulated coherent light beam and for projecting the light beam onto the donor member mounted on the drum member to transfer an image onto the receiver member by the transferance of a dye from the donor member. Means is provided for moving the light beam projection means axially along the drum member and for coordinating the motion of the drum member with the motion of the light projection means to repeatably register the image on the receiver member. A supply means selectively supplies a sheet of a receiver material and a sheet of a donor material to the support member. The drum member is provided with vacuum sheet holding means for adhering a receiver sheet and a donor sheet to the drum member in superposed relation. First means is provided for selectively removing the donor sheet from superposition with the receiver sheet on the drum member, and second means is provided for selectively removing the receiver sheet containing an image from the drum member.

In a further embodiment of the present invention a thermal imaging apparatus comprises a horizontal imaging drum member mounted for rotation about its axis and arranged to mount a receiver member and a donor member in superposed relationship thereon. Means is provided for generating a plurality of modulated coherent light beams and for projecting the light beams as a line inclined at an angle to the axis of the drum member onto the donor member mounted on the drum member to transfer an image onto the receiver member by transferring a dye from the donor member. Means is provided for reversibly rotating the drum member and means is provided for moving the projecting means axially of the drum member. A supply means is arranged to selectively supply a receiver member and a plurality of donor members to the drum member, with the supply means being arranged to supply a plurality of donor sheets sequentially to be individually superposed and imaged on a single receiver sheet. The receiver member has a first width and the donor members have a second width greater than that of the receiver member. Means is provided for selectively registering the different sheets axially along the length of the imaging drum member. A loading roller is arranged to selectively engage the surface of the imaging drum member to engage the donor sheets and to smoothe them into engagement with the surface of the receiver sheet on the imaging drum member. A first means is operable to engage an end edge of a donor sheet to remove it from superposition with the receiver sheet when the imaging drum member is rotated in a first direction without moving the receiver sheet, and second means is operable to engage an end edge of a receiver sheet to remove it from the drum member when the drum is rotated in a second direction.

In a still further embodiment of the present invention, a method of thermal imaging is provided comprising the steps of selectively supplying a receiver member and a plurality of donor members to a horizontal imaging drum member mounted for rotation about its axis. The plurality of donor sheets are supplied sequentially and are individually superposed and imaged on a single receiver sheet. A receiver member and a donor member are mounted in superposed relationship on the drum member and are selectively registered axially along the length of the imaging drum member. A loading roller is selectively engaged with the surface of the imaging drum member to engage the donor sheets and to smoothe them into engagement with the surface of the receiver sheet on the imaging drum member. The drum member is rotated and a plurality of modulated coherent light beams are generated and projected as a line inclined at an angle to the axis of the drum member onto the donor member to transfer an image onto the receiver member by the transference of a dye from the donor member. The projecting means is moved axially of the rotating drum member, The imaging drum member is rotated in a first direction and an end edge of a donor sheet is engaging to remove it from superposition with the receiver sheet without moving the receiver sheet. The drum member is rotated in a second direction and an end edge of a receiver sheet is engaged to remove the receiver sheet from the imaging drum.

Various means for practicing the invention and other features and advantages thereof will be apparent from the following detailed description of illustrative, preferred embodiments of the invention, reference being made to the accompanying drawings.

BRIEF DESCRIPTION OF THE DRAWINGS

FIG. 6 is a perspective view of the imaging drum and the write head of the present invention, partially cutaway to reveal hidden portions thereof;

FIG. 12 is a cross section of the imaging drum and its drive assembly;

FIG. 13 is a cross sectional view of the imaging drum taken along line 13—13 of FIG. 12 illustrating the location of the vacuum chambers;

FIG. 15 is a view of the generated surface of the imaging drum;

FIG. 16 is an elevation view of the vacuum control valve actuator cam taken along line 16—16 of FIG. 17;

FIG. 17 is a side view of the actuator cam showing the actuation of the donor load and unload vacuum control valve by the actuator cam;

FIGS. 21a—21c are schematic illustrations of the application of vacuum to various regions of the imaging drum;

FIGS. 23a-23c, which form FIG. 23, are tabulations of drum operating conditions at each of the steps of material loading and unloading;

DESCRIPTION OF THE PREFERRED EMBODIMENT

Overall Apparatus

Figure 1:
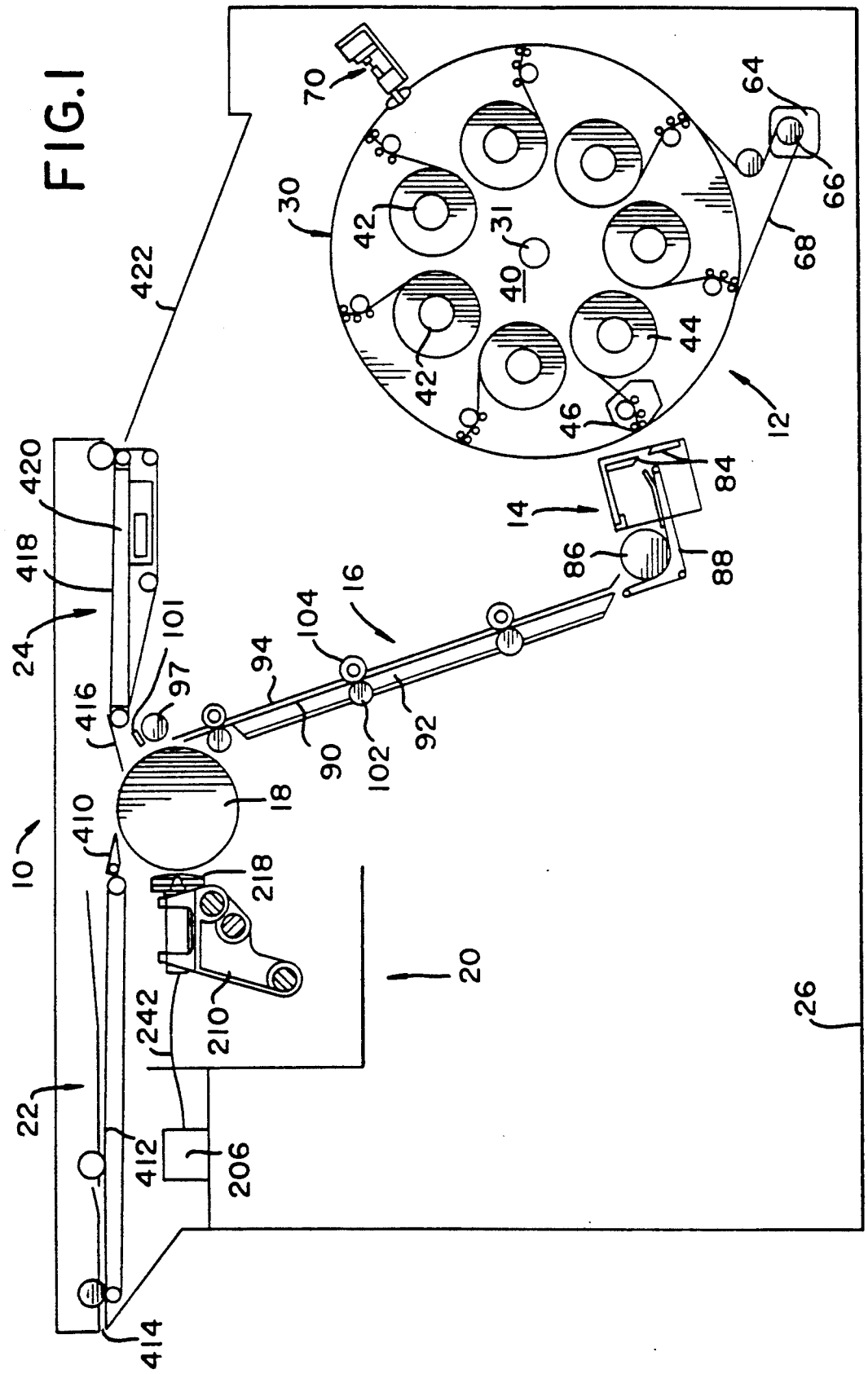
FIG. 1 is a side elevation schematic view of a proofing printer of the present invention.

The overall laser thermal printer proofer 10 of the present invention is illustrated in FIG. 1 and comprises generally a material supply assembly 12, a sheet cutter assembly 14, a sheet transport assembly 16, an imaging drum 18, a writehead assembly 20, a waste transport 22, and an image exit transport 24, which will all be described in greater detail hereinbelow. The arrangement of the components within the enclosure or cabinet 26 is such that the imaging drum 18 and the writehead assembly 20 are disposed in the upper central region of the cabinet. The material supply assembly 12 is disposed in the lower portion at one end of the cabinet, with the sheet cutter assembly 14 disposed adjacent the material supply assembly, again in the lower portion of the cabinet. The sheet transport assembly 16 extends from the sheet cutter assembly 14 to adjacent the imaging drum 18, generally opposite to the writehead assembly 20.

The overall operation of the apparatus comprises removing a portion of the supply of a receiver material from the material supply assembly 12, measuring it and cutting it to length in the sheet cutter assembly 14, and then transporting the cut sheet via sheet transport assembly 16 to the imaging drum 18 about which it is wrapped, registered, and secured. A length of donor material is then removed from the material supply assembly 12, cut to length by the sheet cutter assembly 14 and transported by the sheet transport assembly 16 to the imaging drum 18. At the imaging drum the donor material is wrapped around the drum and superposed in the desired registration with the receiver material already secured thereon. After the donor material is secured to the periphery of the drum, the writehead assembly is traversed axially along the drum as the drum is rotated, and an image is imparted to the receiver sheet. After the image has been written on the receiver sheet, the donor sheet is removed from the imaging drum, without disturbing the receiver sheet, and transported out of the apparatus via waste exit transport 22. Additional donor sheets are sequentially superposed with the receiver sheet on the drum and are imaged onto the receiver until the desired image is obtained and the completed image is exited from the apparatus via the image exit transport 24. A more detailed description of the apparatus and the operation thereof follows.

Heretofore, thermal imaging apparatus has employed one of two material handling approaches; either all of the material has been supplied and fed in sheet form, or one element has been supplied and fed as a sheet and the other has been supplied and fed as a web. Each of these approaches has certain disadvantages. The supply of material in the form of sheets increases the cost of manufacturing the material as well as increases the probability of double feeding of the sheets. Since any double feeding of any of the sheets would render that image unacceptable, as well as risk damage to the apparatus, this is a less desirable approach. The supply and use of one of the materials in web form necessitates the use of an image writing assembly that is capable of writing an entire line at one time and thus a very long writing array to produce the entire line. Such long writing arrays are difficult and costly to manufacture, but are even more difficult to accurately control over the entire line to provide the image consistency required for proof quality images. Accordingly, the present invention provides the ability to produce proof quality images from material which is supplied and fed in web form to reduce both the cost and the problem of double feeding, and yet cuts the web into sheet form before use so that the sheets may be accurately superposed onto a rotating imaging drum that may be written on by a writing array that is relatively small and provides a consistent image across the entire image, as well as being relatively easy and inexpensive to manufacture. Further, with the supply of the material in roll form, with automatic feeding and cutting thereof, the machine cabinet can be sealed against the entry of environmental dirt that could otherwise enter the unit and possibly adversely effect image quality. Thus, the present invention provides the advantageous attributes of both kinds of thermal imaging apparatus of the prior art.

MATERIAL SUPPLY ASSEMBLY

Figure 2:
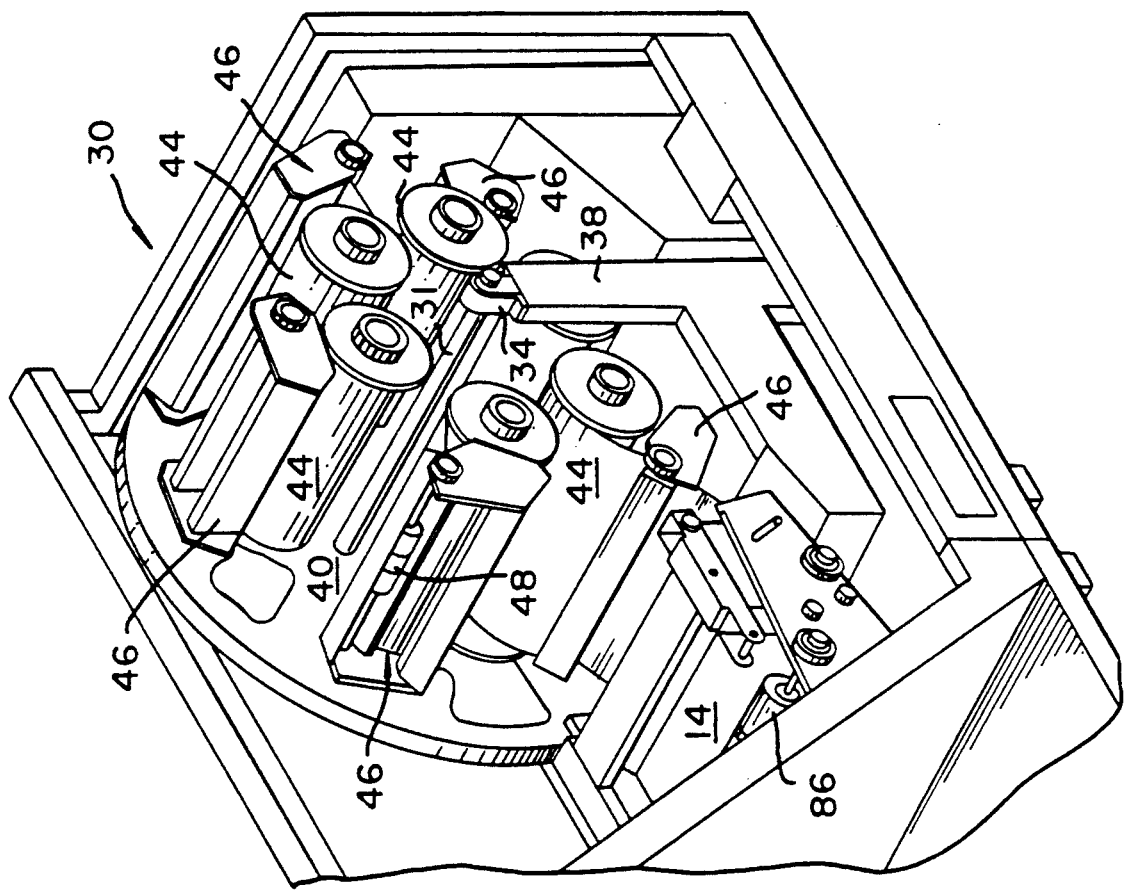
FIG. 2 is a front perspective view of a material supply carousel.
Figure 26:
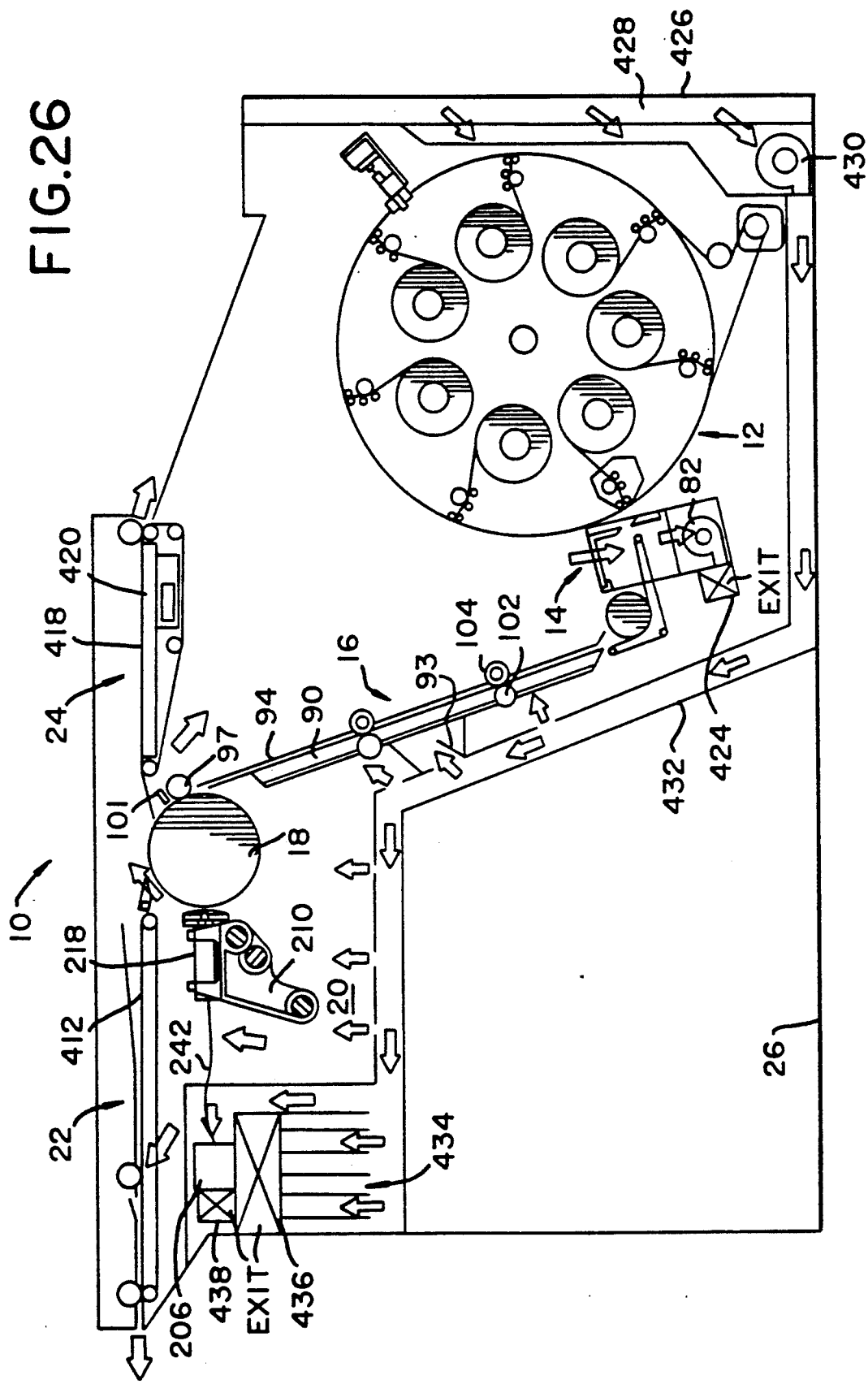
FIG. 26 is a schematic view of the air flow through the proofing printer of the present invention.

The material supply assembly 12 is illustrated in FIGS. 1-4 and comprises a carousel assembly 30 mounted for rotation about a horizontal axis 31 on bearings 32 and 34 at the upper ends of vertical supports 36 and 38. The carousel comprises a vertical circular plate 40 having a plurality of material supporting spindles 42 cantilevered outwardly from and equispaced about the front face of the plate. Each of the spindles 42 is arranged to carry a roll supply of material 44 for use on the imaging drum 18. In the embodiment illustrated in FIGS. 1, 3, and 26, seven spindles are provided, with one spindle arranged to carry a roll of receiver material, and four spindles arranged to carry four different rolls of donor material to provide the four primary colors used in the writing process, e.g. cyan, magenta, yellow, and black. Two additional spindles are provided to give the operator the opportunity to also install specialty colors, if desired, without the need of removing any of the other donor or receiver rolls. Alternatively, a greater or lesser number of spindles may be provided depending upon the needs of the user. For example, FIG. 2 illustrates a carousel having six spindles. Each of the material supply spindles is provided with a corresponding material feeder assembly 46, only one of which is illustrated in FIG. 1. Each of the material feeder assemblies is arranged to withdraw the end of the roll material from the rolls 44 carried on the spindles 42. The end of the material is fed between the nip of a driven roll 48 and a pair of pressure rollers 50 and is fed out of the carousel through guides 52 and corrugating rollers 54. The drive roller 48 is mounted on a shaft 56 which extends through the carousel plate 40 to the rear side thereof and which is provided with a driven gear 58, to be described more thoroughly hereinbelow. The pressure rollers 50 are mounted on an assembly 60 which is provided with a spring 62 which urges the pressure rollers into engagement with the drive roller 48. The edge guides 52 are arranged to locate the end of the web of material to prevent it from drooping during periods when the equipment is not in operation. The corrugating rollers 54 are arranged to impart a slight corrugation to the material across the width thereof to provide increased structural rigidity thereto to facilitate guiding it into the sheet cutter assembly.

The roll material is provided to the apparatus an flangeless cores to economize cost and weight. The flanges for the rolls are part of the spindles of the carousel. The weight of the roll of material is sufficient to keep the roll from telescoping, clockspringing, or unwinding unless the material is driven by the drive roller 48.

Figure 3:
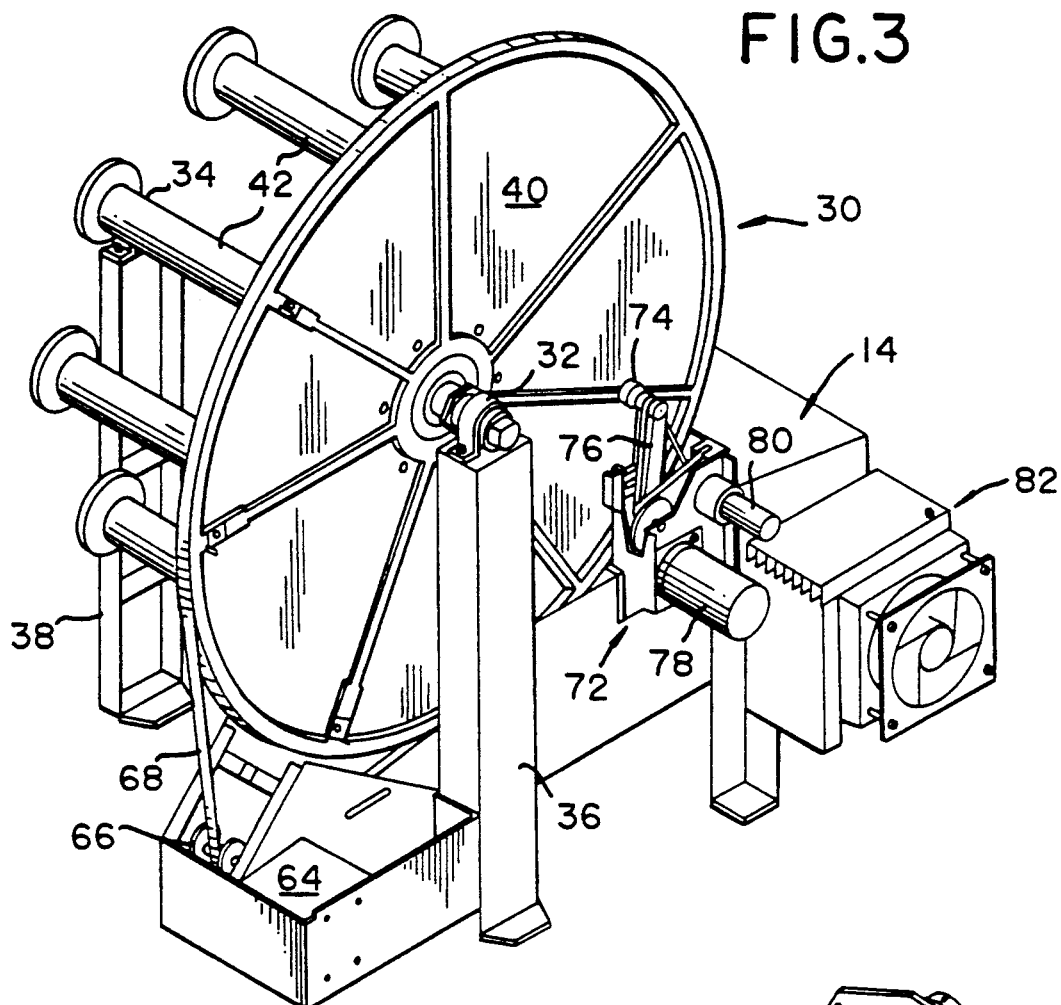
FIG. 3 is a rear perspective view of the material supply carousel.
Figure 4:
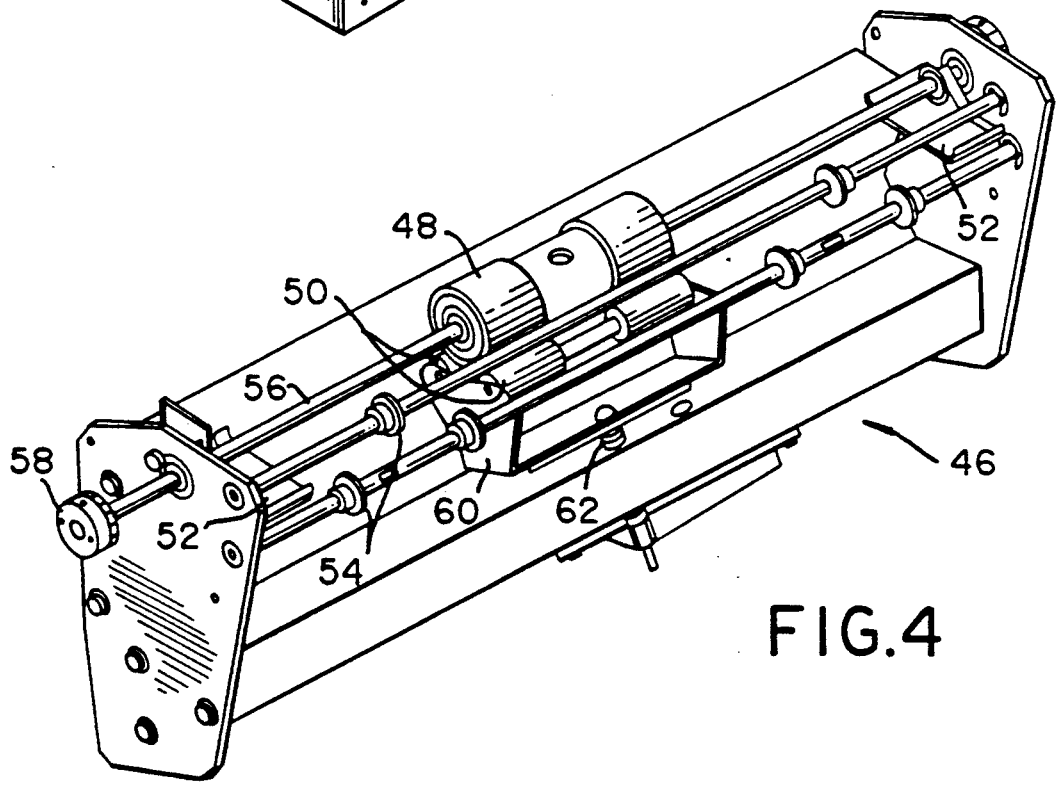
FIG. 4 is an enlarged perspective view of a material feed drive.

The carousel 30 is rotated about its axis to bring a selected roll supply of material into opposition with the sheet cutter assembly 14 where the material is removed from the roll supply, is fed through the cutter assembly 14, is measured, and is then cut. The carousel is rotated, counterclockwise in FIG. 1, by means of a drive motor 64 driving a sheave 66 which engages a belt 68 that is tensioned about the periphery of the carousel plate 40. A brake assembly 70 is arranged to hold the carousel stationary when it is not being driven by motor 64. A common drive assembly 72 is provided for all of the material feeder assemblies 46, and is also illustrated in FIG. 3. The drive assembly comprises a drive gear 74 disposed at the end of a rotatable arm 76. The gear 74 is driven by motor 78 and the arm 76 is rotated by motor 80 between an at rest position, shown, wherein the drive gear 74 is located out of the path of the driven gears 58 associated with each material supply assembly as the carousel is rotated, and an operative position wherein the drive gear 74 engages the driven gear 58 of the material feed assembly located at the material feed location to provide power to the drive roll 48 to feed the material from the roll supply to the sheet cutter assembly. Also illustrated in FIG. 3 is an exhaust fan assembly 82 which operates to exhaust air from the sheet cutter assembly 14, as will be described more thoroughly hereinbelow.

In the preferred embodiment, the roll supplies of donor and receiver materials provided to the printer apparatus are preferentially each wound on their respective cores in a unique fashion. The receiver material, on to which the image is to be transferred by the write head, and which is the surface of that web which is most sensitive to contact damage, is wound with the receiving surface on the outer surface of the web as it is wound upon the core. On the other hand, the donor material, with an active surface from which the dye material is transferred onto the receiver material, and which surface is most sensitive to contact damage, is wound with the dye material on the inner surface of the web. As a result, these two material may be supplied over a common path, using common transport apparatus without the "sensitive" surfaces of each material being adversely contaminated by contact with transport surfaces which have previously contacted and possibly been contaminated by the "active" surface of the other material. In addition, each of the materials is laid onto the imaging drum with the proper surface orientation, i.e. with the active surfaces facing each other. Thus, the receiver sheet is transported with the support of the material down and the receiver surface up, and the donor material is transported with the support surface up and the active donor surface down, without damaging either of the respective "sensitive" surfaces. In addition, it will be seen that any curl in the respective materials, from being wound in the supply roll, will match and compliment the curvature of the imaging drum when the material is supported thereon, simplifying the feeding and adherence of the respective materials to the imaging drum.

SHEET CUTTER ASSEMBLY

The sheet cutter assembly 14 (FIG. 1) is disposed adjacent the material supply carousel 30 at the material feed location and is arranged to receive the end of the web material as it is fed by the material feed assembly 46. The sheet cutter assembly comprises a mating pair of cutter blades 84 through which the web material is moved by the material feed assembly 46. A material metering drum 86 and mating endless drive belt 88 cooperate to engage the web material as it is driven between the cutter blades 84, to assist the feeding thereof, and to change its path from substantially horizontal to a generally vertical direction. The metering drum and a sensor, not shown, are arranged to sense the end of the web material being fed and to determine when the desired length of the sheet has been fed between the cutter blades 84. At that point, the metering drum 86 and the cooperating belt 88, as well as the drive assembly 72, are stopped and the cutter blades are actuated to chop a sheet member from the end of the web material. The web metering arrangement is capable of providing sheets having two different lengths, as is necessary when cutting the receiver material and the donor material, since it is desired to form the donor material with a greater length than the receiver material so that it overlies the leading and trailing ends of the receiver material when they are superimposed upon the imaging drum. The material metering drum 86 and its cooperating endless belt 88 are so constructed that they gently engage the material being transported so that there is no relative motion between the material and the surfaces of the drum and the belt. Thus, the metering drum and belt do not scratch or otherwise damage the sensitive surface of the material being fed.

SHEET TRANSPORT ASSEMBLY

Figure 5:
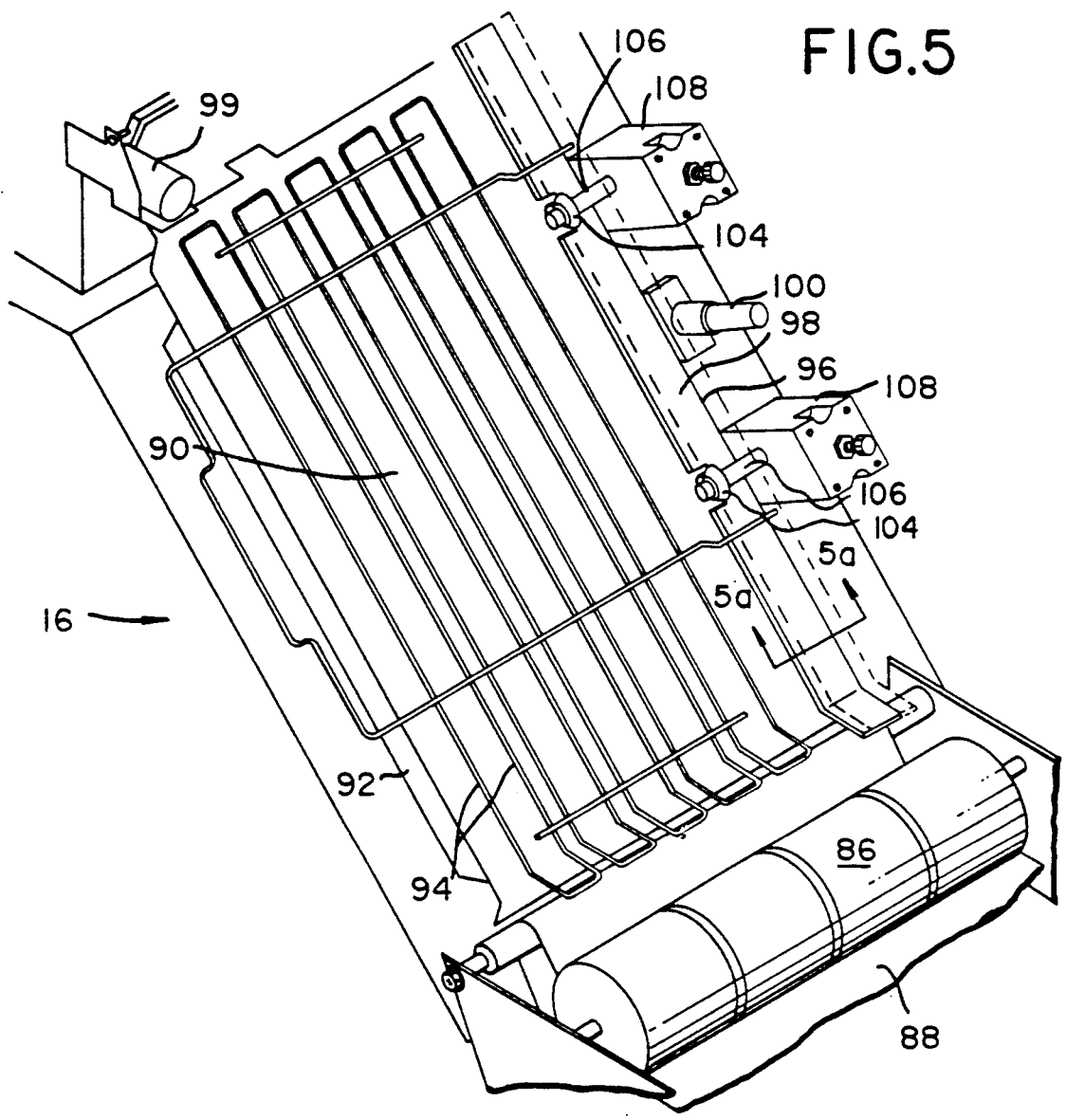
FIG. 5 is a perspective view of the sheet transport assembly.

After a sheet has been cut from the end of the roll of material, it is discharged from the metering drum and belt, generally upwardly into a vertical sheet transport assembly 16, which is shown in greater detail in the perspective view of FIG. 5. The sheet transport assembly comprises an upwardly directed air table 90 having a plurality of air holes, not shown, opening therethrough into an air chamber 92 therebeneath. The air chamber is provided with a source of pressurized air from a source to be described later, which air escapes through the holes in table 90 to support a sheet member thereon. The supply of air to the air chamber is controlled by a damper valve 93 (see FIG. 26) in the inlet to the air chamber. A plurality of wire guides 94 are suspended above the surface of table 90 to limit the upward movement of the sheet member due to the air flow through the air table. One edge of the air table is provided with an edge guide 96 which depends from a plate 98 which lies in substantially the same plane as the wire guides 94. The edge guide is movable between a first position, shown in solid lines, and a second position, shown in dotted lines, by a cam mechanism 100. Three pair of soft flexible drive rollers 102 and 104 are disposed along the lateral edge of the air table adjacent the edge guide. The rollers 104 are conical in shape with the larger diameter disposed adjacent the edge guide 96. The rollers 104 form a nip with rollers 102 and are arranged to gently engage the lateral edges of the sheets being transported thereby to drive the sheet toward the imaging drum and to urge it against the edge guide to provide the desired lateral registration of the sheet with respect to the drum axis. The rollers 104 are mounted on shafts 106 which are driven through gear boxes 108 which are supplied with power from a motor, not shown.

Figure 5A:
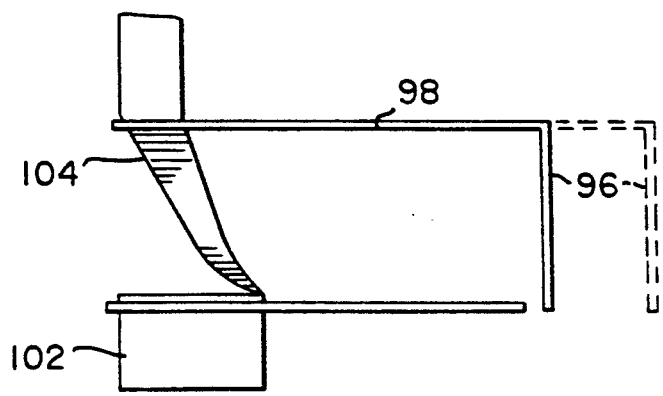
FIG. 5a is a cross sectional view taken along line 5a—5a of FIG. 5.

The edge guide 96 is movable between two positions in order to properly deliver the receiver sheet and the donor sheet to the imaging drum at the proper axial location. As noted above, the receiver sheet is first laid onto the imaging drum and then a donor sheet is superposed over the receiver sheet. To ensure complete coverage of the receiver sheet by the donor sheet, and to facilitate the application of a vacuum to the interface between the superposed donor and receiver, the donor sheet is arranged to extend beyond all four edges of the receiver sheet. Thus, the donor sheet must be wider than the receiver sheet. Accordingly, when the edge guide 96 is in its first position, shown in solid lines in FIGS. 5 and 5a, the receiver sheet is properly axially positioned along the length of the drum. When the edge guide is disposed in the second position, indicated by the dotted line illustration in FIGS. 5 and 5a, the donor sheet is properly axially positioned along the length of the imaging drum. As noted above, the tapered rolls 104 exert a lateral force on the sheet engaged thereby gently forcing it into the edge guide 96 to assure the proper lateral positioning of the receiver and the donor sheets.

The operation of the material supply assembly comprises rotating the carousel wheel 40 (FIGS. 1 and 4) so that the supply roll 44 of the receiver material is located adjacent the sheet cutter assembly 14. The arm pivot motor 80 of the feed assembly drive is operated to rotate the drive gear 74 into engagement with the driven gear 58 of the respective drive roll 48. The gear drive motor 78 is then energized to rotate the drive roll 48 to feed the end of the web of receiver material into the sheet cutter assembly 14. The metering roll 86 and the mating endless belt 88 are actuated, engaging the end of the receiver material web and driving it along the path through the sheet cutter assembly until the end of the web is sensed and the appropriate length is drawn off the supply roll 44. The metering roll 86 is then stopped and the cutter blades 84 are actuated to sever a sheet of receiver material from the receiver supply roll. Inasmuch as the receiver material sheet is the first to be supplied to the imaging drum, the edge guide 96 of the sheet transport assembly is set in the first position, illustrated in solid lines in FIG. 5, to deliver the receiver sheet to the proper axial location on the imaging drum. Since the receiver material is driven with the sensitive surface up as it is moved into the sheet transport assembly by the metering roll 86 and the belt 88, the air supply to the air table 90 is turned off by closing the damper valve 93 to the air chamber 92, so that the lower, support surface of the receiver material sheet rests upon the air table 90. At this time, the rolls 102 and 104 are actuated, moving the receiver sheet up the sheet transport assembly to close proximity with the imaging drum 18, with the tapered rolls 104 assuring that that edge of the receiver sheet is guided by the edge guide 96. A sheet loading squeegee roller 97 is mounted axially of the imaging drum for selective engagement with the imaging drum at the upper end of the sheet transport assembly 16, as illustrated in FIGS. 1 and 5. The squeegee roller is so mounted that it can be moved by means of a motor or solenoid 99, see FIG. 5, into an operative loading position to force a sheet being loaded onto the imaging drum into intimate contact therewith to remove all air from the interface therebetween, or to an idle position out of the way of a sheet being fed to the drum. A sheet sensor 101 is disposed just above the squeegee roller 97 and is spaced from the surface of the drum sufficiently to be out of the paths of the sheet material being supplied to the drum (see FIG. 1). In the preferred embodiment, the sensor is responsive to light reflected from the surface of the drum or from a reflective surface of one of the sheets on or being supplied to the drum. The operation of the sensor 101 will be more thoroughly described with respect to the overall operation of the apparatus hereinbelow.

Since the receiver sheet is transported with the support surface down and the receiving surface up, the support surface of the sheet is the one which contacts the air table 90 and the sensitive receiver surface is not in contact with the guide wires 94. The drive rollers 104 only contact the receiver surface and are moving with the sheet and thus do not scuff or scrape the receiver surface.

After the receiver sheet has been attached to the imaging drum, as is described hereinabove, the first donor material is supplied in a manner similar to that for the receiver material, except that the metering drum and the length sensor are arranged to generate a donor sheet which is longer than the receiver sheet. As the donor material is fed to the sheet transport assembly 16, the air table 90 is actuated by opening the damper valve 93 to permit air flow therethrough and the donor sheet is lifted by the air, away from the surface of the table into contact with the guide wires 94. However, since the donor material is being fed with the support surface up and the donor surface down, the relative motion of the donor support against the guide wires 94 causes no damage to the donor surface. Similarly, the sensitive donor surface is contacted only by the rollers 102 which are driving the donor toward the imaging drum. Since the donor sheet is wider than the receiver sheet, and the donor is intended to overlap all of the edges of the receiver on the imaging drum, the edge guide 96 is moved to the second position, shown in dotted lines, before the donor sheet is fed to the sheet transport assembly 16 by the metering drum and belt 86 and 88. It will be seen that the respective "sensitive" surfaces of the receiver sheets and the donor sheets face different contacting surfaces in the sheet cutting assembly, the metering assembly, and the sheet transport assembly so that, should either of the "sensitive" surfaces of either sheet be rubbed off onto any of the apparatus surfaces, the "sensitive" surface of the other material will not come into contact with the apparatus surfaces contaminated by the first material. In other words, the sensitive surface of the receiver material only faces but does not normally contact the guide wires 94, and since the guide wires 94 only contact the support surface of the donor, the guide wires will not pick up any residue from the dye-containing surface of the donor. Similarly, since the air table 90 only contacts the support surface of the receiver material, it will not pick up any of the material from the receiver side thereof, and since the donor material only "sees" but normally does not contact the air table surface, the donor surface can not pick any residue up from the receiver sheet from the surface of the air table 90.

IMAGING ASSEMBLY

Referring now to FIG. 6, a perspective view of the imaging drum 18 and the writehead assembly 20 is illustrated. The imaging drum is mounted for rotation about an axis 202 in frame member 204. The imaging drum member 18 is adapted to support a thermal print medium of a type in which a dye is transferred from a donor element to a receiver element as a result of heating the dye in the donor. The donor element and the receiver element are superposed in intimate contact and are held onto the peripheral surface of the drum member by means such as by vacuum applied to the superposed elements from the drum interior as will be more thoroughly described hereinbelow. A thermal print medium for use with the printer proofer 10 of the present invention can be, for example, the medium disclosed in U.S. Pat. No. 4,772,582, which includes a donor sheet having a material which strongly absorbs at the wavelength of the exposing light source. When the donor element is irradiated, this absorbing material converts light energy to thermal energy and transfers the heat to the dye in the immediate vicinity, thereby heating the dye to its vaporization temperature for transfer to the receiver element. The absorbing material may be present in a layer beneath the dye, or it may be admixed with the dye and is strongly absorptive to light having wavelengths in the range of 800 nm–880 nm. An example of a preferred embodiment of a receiver element that can be used with the present invention is disclosed in co-pending, commonly assigned U.S. patent application Ser. No. 606,404, entitled Intermediate Receiver Opaque Support, and filed Oct. 31, 1990. The receiver element disclosed therein incorporates a reflective layer which improves the efficiency of the dye transfer to the receiver element.

An imaging light source is movable with respect to the imaging drum and is arranged to direct a beam of actinic light to the donor element. Preferably the light source comprises a plurality of laser diodes which can be individually modulated by electronic signals which are representative of the shape and color of the original image, so that each dye is heated to cause volatilization only in those areas in which its presence is required on the receiver to reconstruct the color of the original object. In the preferred embodiment, the laser diodes 206 are mounted remotely from the drum member 18, on the stationary portion of the frame 204, and each direct the light produced thereby to the input end of a respective optical fiber 208 which extends to and transfers the light to the movable writing head assembly 20 adjacent the drum member. The laser diodes are selected to produce a first beam of light having wavelengths in the range of 800 nm–880 nm, and preferably predominately at a wavelength of 830 nm.

Figure 9:
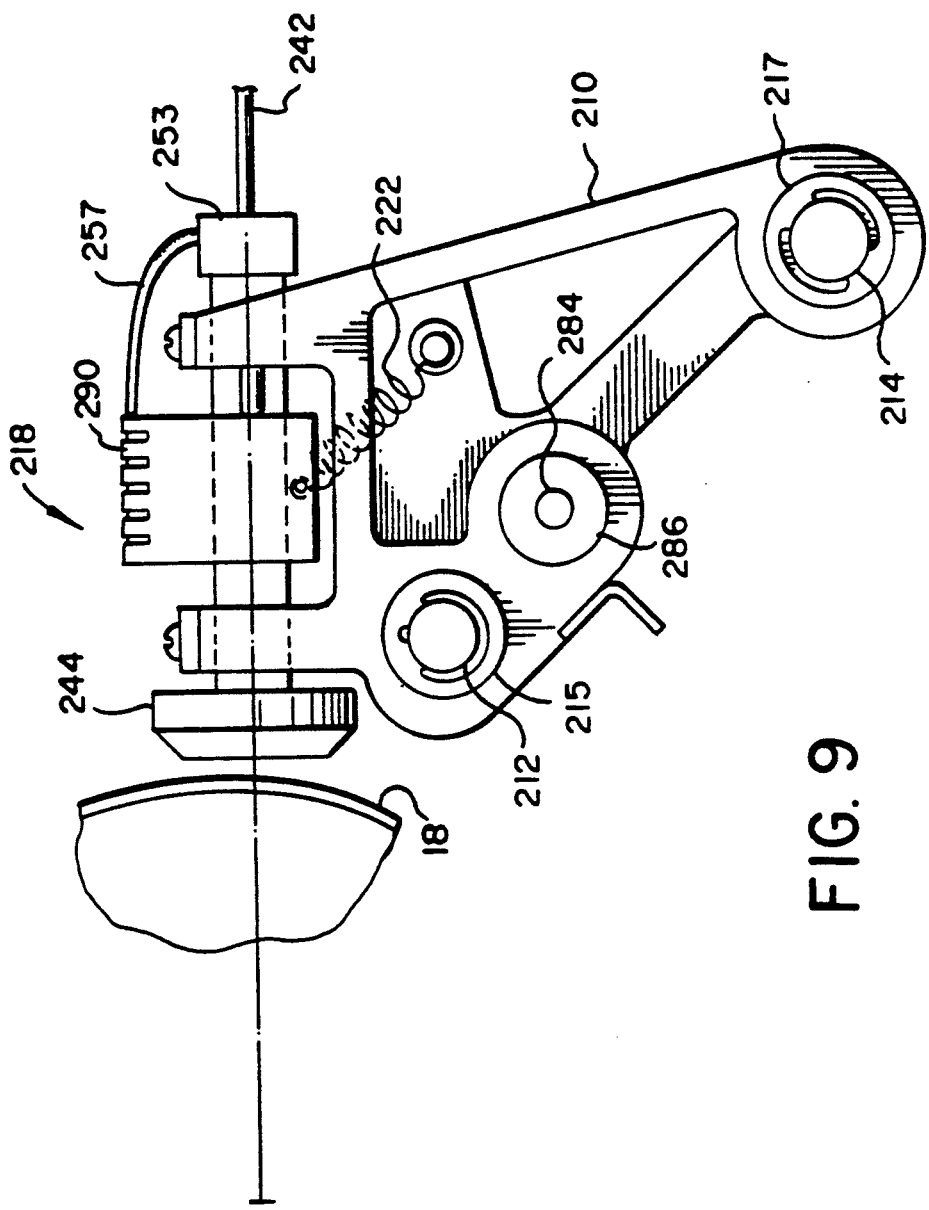
FIG. 9 is a schematic side view of the write head translation drive taken along line 9—9 of FIG. 8.

The writehead assembly 20 is moveably supported adjacent the imaging drum 18 and comprises a writing head 218 which is mounted on a moving translator member 210 which, in turn, is supported for low friction slidable movement on bars 212 and 214. The bars 212 and 214 are sufficiently rigid that they do not sag or distort between the mounting points at their ends and are arranged as exactly parallel with the axis of the drum member as possible. The upper bar 212 is arranged to locate the axis of the writing head 218 precisely on the axis of the drum with the axis of the writing head perpendicular to the drum axis. The upper bar 212 locates the translator in the vertical and the horizontal directions with respect to the axis of the drum member. As illustrated in FIG. 9, the translator bearing 215 for the upper bar contacts only the upper surface of that bar as an inverted "V" to provide only that constraint to the translator, and is held in place by the weight of the translator. The lower bar 214 locates the translator member only with respect to rotation of the translator about the bar 212 so that there is no over-constraint of the translator which might cause it to bind, chatter, or otherwise impart undesirable vibration to the writing head during the generation of an image. This is accomplished by the lower bearing 217 which engages the lower bar only on diametrically opposite sides of the bar on a line which is perpendicular to a line connecting the centerlines of the upper bar and the lower bar. It has been found that such sliding bearings are superior for this application because they do not impart periodic motion to the translator assembly, and thus to the write head and the image generated thereby, which is often visible in the resulting image as banding that is readily percieved by the eye. Ball or roller bearings, even of high precision, are known to cause such periodic vibrations, which grow progressively worse as the bearings age. With the bearings used in the preferred embodiment, as they age, they merely cause the optical axis of the write head to shift slightly with respect to the drum axis which will not be perceived in any single image. Furthermore, such sliding bearings are toleranced such that they cannot be made too tight so as to bind and cause jitter in the translator that would degrade the quality of the image generated therewith.

TRANSLATOR DRIVE

Figure 8:
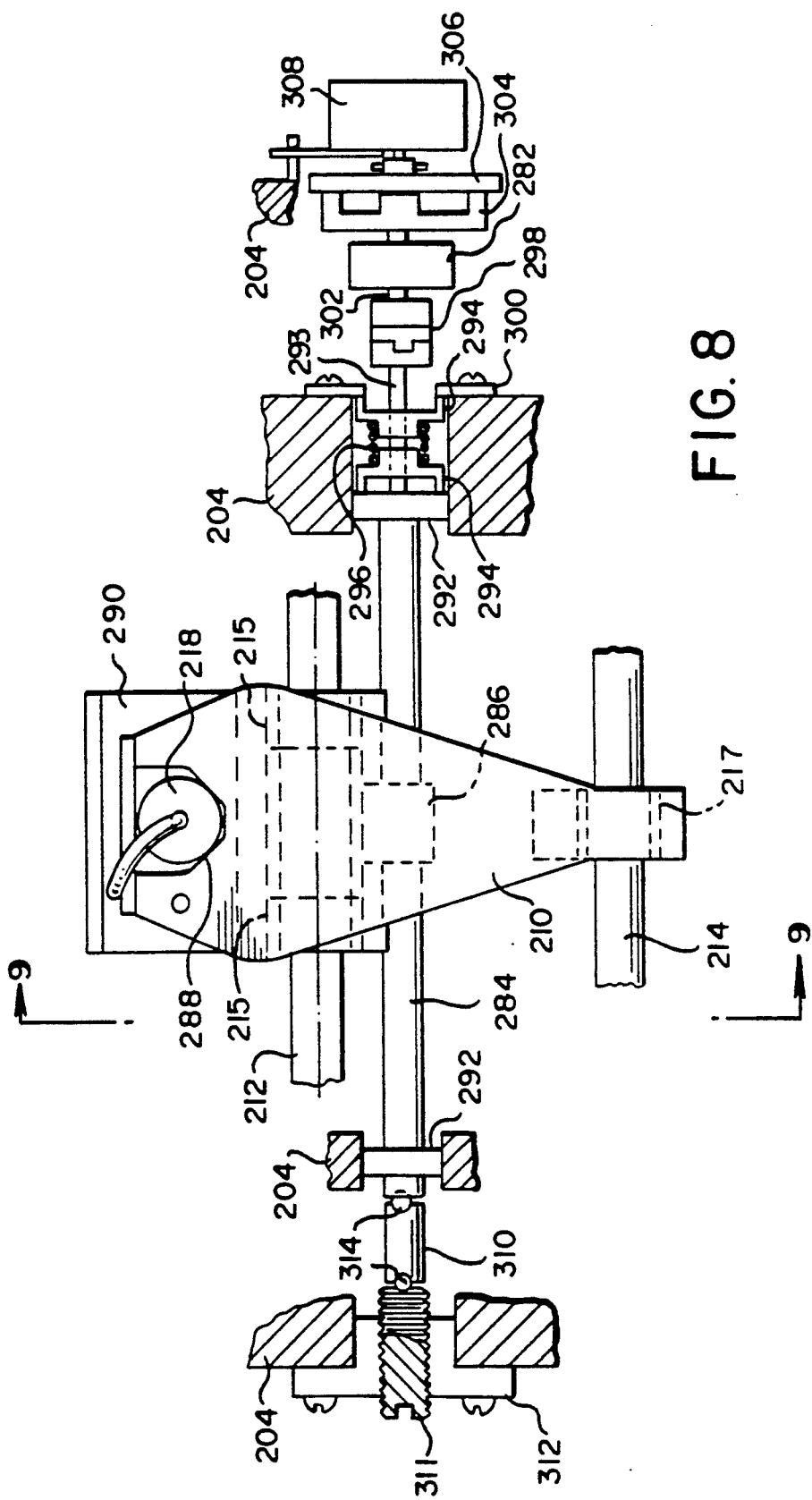
FIG. 8 is a schematic elevation of the write head translation drive.

Referring now to FIGS. 8 and 9, the translator member 210 is driven by means of a motor 282 which rotates a lead screw 284 parallel to bars 212 and 214 to move the writing head parallel with the axis of the drum member. The coupling 286 (see FIG. 8), which connects the drive nut on the lead screw to the translator member, is arranged to accommodate misalignment of the drive nut and the lead screw so that only forces parallel to the linear lead screw and rotational forces are imparted to the translator by the lead screw and the drive nut. Moreover, the coupling is connected to the translator by means of a split sleeve that is freely movable over the coupling and within the bore of the translator member until it is fixed by means of a set screw that clamps the sleeve to both the translator and to the coupling. In this way, it is possible to release the set screw and remove the sleeve from the translator and the coupling, and even from around the lead screw, so that the lead screw can be withdrawn from the translator and from the frame member for repair or replacement without the need to remove the translator from the apparatus.

The writing head 218 is removably mounted in V-shaped beds 288 which are formed in the translator member 210 in precise relationship with the bearings 215 for the upper bar 212 so that it automatically adopts the preferred orientation with respect to the drum axis noted above. The writing head is selectively locatable with respect to the translator, and thus with respect to the drum surface, with regard to its distance from the drum surface, and with respect to its angular position about its own axis. Accordingly, a pair of adjustable locating means are provided to accurately locate the writing head with respect to these two axes on the translator member 210. Only one of the adjustable locating means, for example a micrometer adjustment screw 220, is illustrated. An extension spring 223 (FIG. 9) is provided to load the writing head against these locating means.

The translator drive lead screw 284 is disposed between the two sides of the machine frame 204 where it is supported by bearings 292. At the drive end, the lead screw shaft 293 continues through the bearing, through a pair of spring retainers 294 separated and loaded by a compression spring 296 to one side of an Oldham coupling 298. One of the spring retainers bears on the outer surface of bearing 292, which has a sliding fit within the bore in the frame member 204, to axially locate the bearing therein. The other spring retainer is located by a lead screw retainer 300 attached to the outer surface of the frame member. The motor 282 is also mounted on the outer surface of frame 204 and includes a through shaft 302, one end of which is attached to the second half of the Oldham coupling 298, and the opposite end of which extends through the flywheel 304 to a clutch 306 and to a shaft rotation encoder 308. The flywheel is only connected to the shaft through the clutch. The opposite end of the lead screw extends through bearing 292 to a wobble rod 310 and an adjustment screw 311 threadedly mounted in an end plate 312 which is attached to the outer face of the frame member 204. The wobble rod is provided with spherical sockets at each end that mate with spherical end surfaces, or balls 314, rigidly mounted in the ends of the lead screw and the adjustment screw.

In the translator drive arrangement the flywheel 304 is attached to the motor output shaft 302 through the clutch 306 and functions to minimize any rotational flutter which might otherwise be imparted to the lead screw by the motor. The flywheel is attached by means of the clutch so that, should the mechanism be suddenly stopped by some malfunction in the writehead assembly or some other portion of the transport, the inertia of the flywheel will not be imparted to the assembly and possibly cause additional damage some portion thereof, since the clutch would release under these conditions. The Oldham coupling 298 accomodates any slight misalignment between the motor mount and the lead screw mount while giving a stiff torsional connection between the two. The use of the wobble rod 310 improves the accuracy and stability of the lead screw against movement in the axial direction. It has been found that the stability and accuracy of such a wobble rod connection is significantly better than that obtainable with thrust bearings. Any variation in the axial location and stability of the lead screw directly affects the accuracy of the placement of the image on the rotating drum. The compression spring 296 loads the lead screw axially against the wobble rod and the adjustment screw 311 and assures that all backlash is removed from the system, while the adjustment screw permits the adjustment of the clearance in the Oldham coupling. Further, the Oldham coupling and the removable end cap 312 permits the removal and replacement of the lead screw without the disassembly of other lead screw drive components or the removal of the writehead assembly and translator.

WRITING HEAD ASSEMBLY

Figure 7:
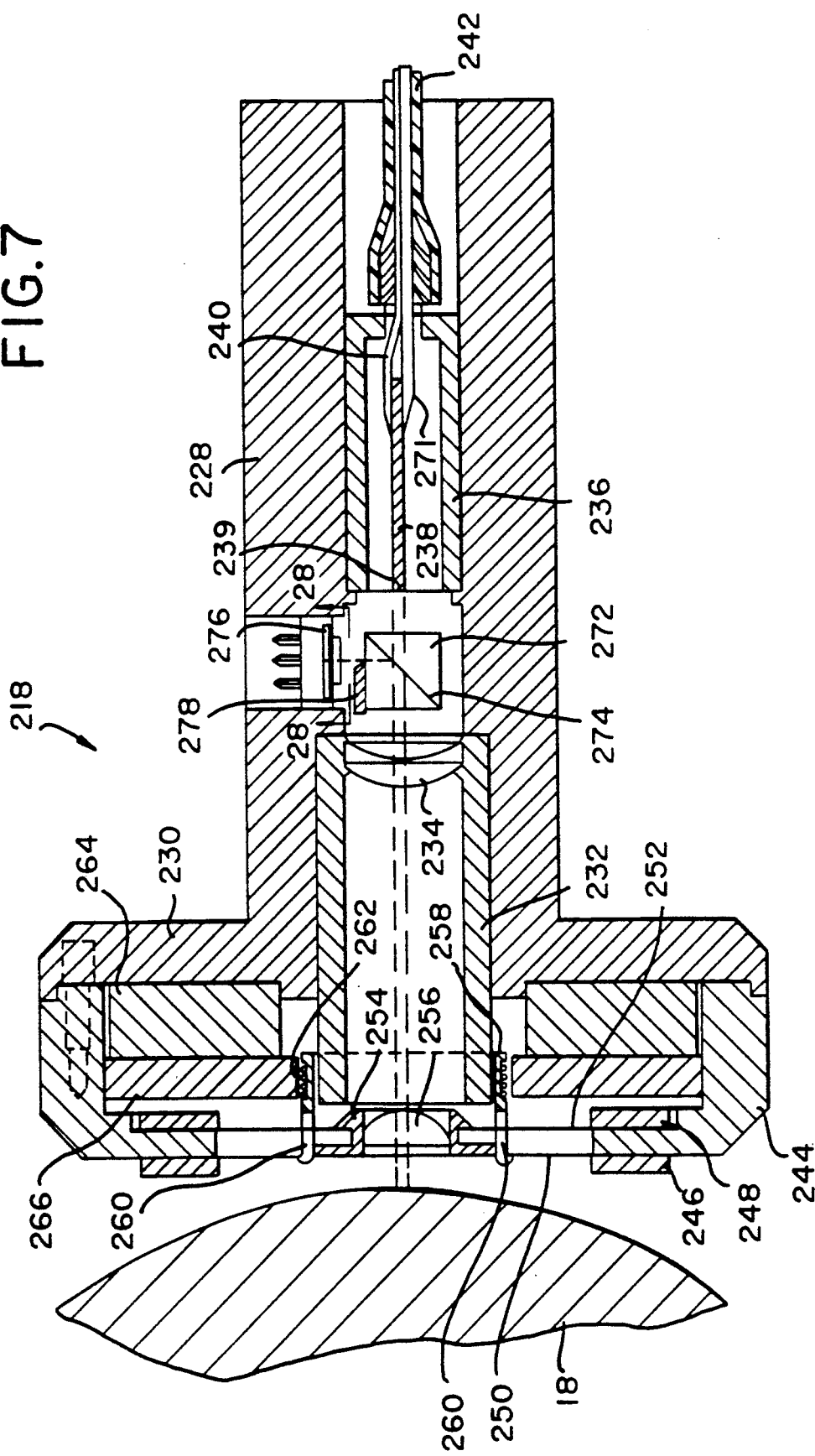
FIG. 7 is a cross sectional view of the writing head and lens assembly taken along line 7—7 of FIG. 6.

FIG. 7 is a cross section of the writing head 218 which comprises a generally cylindrical barrel portion 228 having a flange 230 at the drum end thereof. The interior of the barrel portion is arranged to accept a stationary lens barrel 232 at the writing end, containing a stationary lens 234. A printhead assembly 236 is selectively oriented within and at the opposite end of the barrel from the writing end. The printhead assembly comprises a tubular member selectively oriented within barrel portion 228 and contains a linear array of optical fibers which includes a fiber-supporting wafer or substrate 238 having a plurality of optical fibers 240 mounted thereon. The optical fibers have a writing end 239 facing the drum member 18 at the opposite end of the barrel. The optical fibers 240 extend from the end of the printhead assembly and out of the writing head barrel through a protective sheath 242 to the diode lasers 206 (see FIG. 1).

A cup-shaped closure member 244 is arranged to mate with the flange 230 of the writing head barrel 228 and forms a housing for the focusing drive means, as will be described hereinbelow. As disclosed in commonly assigned, copending U.S. application Ser. No. 670,095, filed in the names of Harrigan and Carson on Mar. 15, 1991, the end of the closure member adjacent drum member 18 is provided with an axially disposed opening which is bridged by a pair of sheet flexure members, 246 and 248, mounted at the outer periphery thereof by annular plate means 250 and 252 to the closure member 244. The central portions of the sheet flexure members are mounted to a movable rigid cylindrical lens housing 254 which contains moveable lens 256. A cylindrical bobbin 258 is disposed around the end of stationary lens barrel 232 and is connected to the moveable lens housing 254 via equally spaced arms 260 which extend between the legs of the flexure members 250 and 252. A voice coil 262 is wound about the cylindrical portion of the bobbin 258 and is connected to a driving circuit, to be further described hereinbelow.

Also enclosed between the end closure 244 and flange 230 is a high power, toroidal magnet 264 and an annular magnetic plate 266 which are both disposed about and spaced from the end of stationary lens barrel 232. The voice coil portion of the bobbin 258 is disposed in the gap between the inner circumference of plate 266 and the outer circumference of stationary lens barrel 232. The dimensions of the magnet, the annular plate, the stationary lens barrel, and the bobbin are such that the bobbin can move freely axially of the lens barrel. The bobbin is supported in the gap by its attachment to the moveable lens housing 254 which is held in position by the plate flexures 250 and 252. It will be noted that the barrel portion 228, flange 230, the stationary lens barrel 232, and annular plate 266, are all formed of magnetic material, such as ordinary steel, so that in combination with the toroidal magnet 264, a strong magnetic field is created between the inner periphery of the annular plate 266 and the end of the stationary lens barrel 232. As a result, when a current is introduced into the voice coil 262 of the bobbin 258, as by a lens focusing circuit (not shown), an axial force is imparted to the bobbin and to the moveable lens housing 254, thereby selectively moving the moveable lens 256 along the optical axis of the assembly. Thus, with an appropriate focus detection system, to be described hereinbelow, the moveable lens assembly may be driven to assure that the output of the fiber optic array is maintained in focus at the appropriate position on the imaging drum 18, or on or within the writing element (not shown) mounted thereon.

The fiber optic array comprises a plurality of fibers 240 which are each connected to a respective, remotely mounted diode laser 206. The diode lasers can be individually modulated to selectively project light from the writing end 239 of the optical fibers through the lens assembly, consisting of stationary lens 234 and movable lens 256, onto the thermal print medium carried by the imaging drum 18. The fiber optic array may be of the type shown in co-pending, commonly assigned U.S. application Ser. No. 451,656, filed Dec. 18, 1989, and comprises optical fibers 240 which are supported on the substrate 238. Each of the optical fibers includes a jacket, a cladding, and a core, as is well known in the art. As disclosed in the copending application, the fibers extend from the laser diodes to the array and are mounted in sets of grooves (not shown) which are formed in the substrate so that the fibers at the writing end 239 are disposed substantially parallel and adjacent to each other in very close proximity, with the ends disposed in a common plane perpendicular to the fiber axes. In the preferred embodiment of the array, twenty writing fibers 240 are employed. As illustrated in commonly assigned, copending U.S. application Ser. No. 670,095, the substrate 238 is disposed in the tubular member of the printhead assembly 236, with the tubular member being provided with a keyway which mates with a corresponding key (not shown) on the inner surface of barrel portion 228 so that the orientation of the linear array 240 is at a preselected angle with respect to the drum axis 202.

The end of the writing head 218 adjacent the imaging drum 18 is provided with a pair of photosensors 226 aimed at the surface of the drum member. The photosensors may each include an infrared source or they may rely on an outside source of light energy. The photosensors are disposed on diametrically opposite sides of the optical axis of the writing head in a fixed relationship thereto. The orientation of the keyway in the outer surface of the printhead assembly 236, the corresponding key on the interior of the barrel portion 228, and the photosensors 226 disposed on diametrically opposite sides of the writing head axis, all correspond so that when the two photosensors 226 are exactly parallel with the axis 202 of imaging drum 18, the writing angle of the linear array 240 is that which has been preselected for the present apparatus.

The determination of this relationship is relatively simply achieved with the present construction inasmuch as a visible line 268 is provided on the drum surface which is carefully fabricated to be parallel with the drum axis. Accordingly, when the photosensors 226 both detect line 268 simultaneously, the writing head has the proper angular orientation to provide the desired angle of the linear array with respect to the drum axis. Adjustment of the angular positioning of the writing head is equally easy to obtain. Hold down clamps 270, which lock the writing head 218 on the translator member 210, are loosened, and the micrometer adjustment screw 220 is adjusted against a stop on the translator member to rotate the head member against the force of the torsion spring 222, or to permit the torsion spring to rotate the writing head in the opposite direction, should that be necessary. When the photosensors 226 both simultaneously detect line 268, which may be accomplished when the drum is either moving or stationary, with or without the writing element disposed thereon, the desired angle between the linear array and the drum axis is achieved. With this construction it is possible to replace the writing head in the field with a new writing head without requiring elaborate setup or alignment, since the predetermined relationship has already been established between the photosensors 226 and the linear array when the writing head is assembled.

Figure 24:
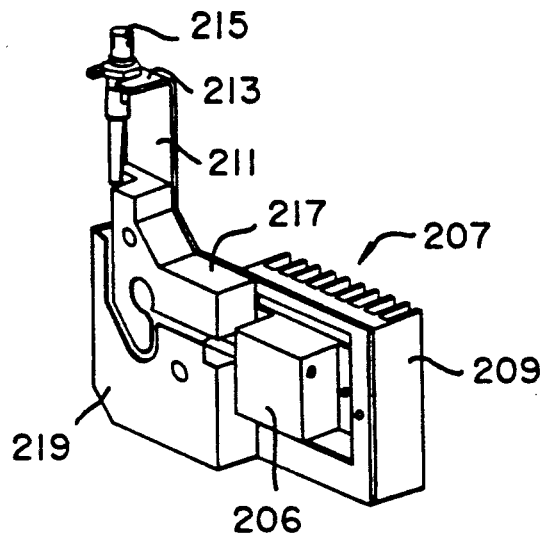
FIG. 24 is a perspective view of a laser mount and fiber guide.
Figure 25:
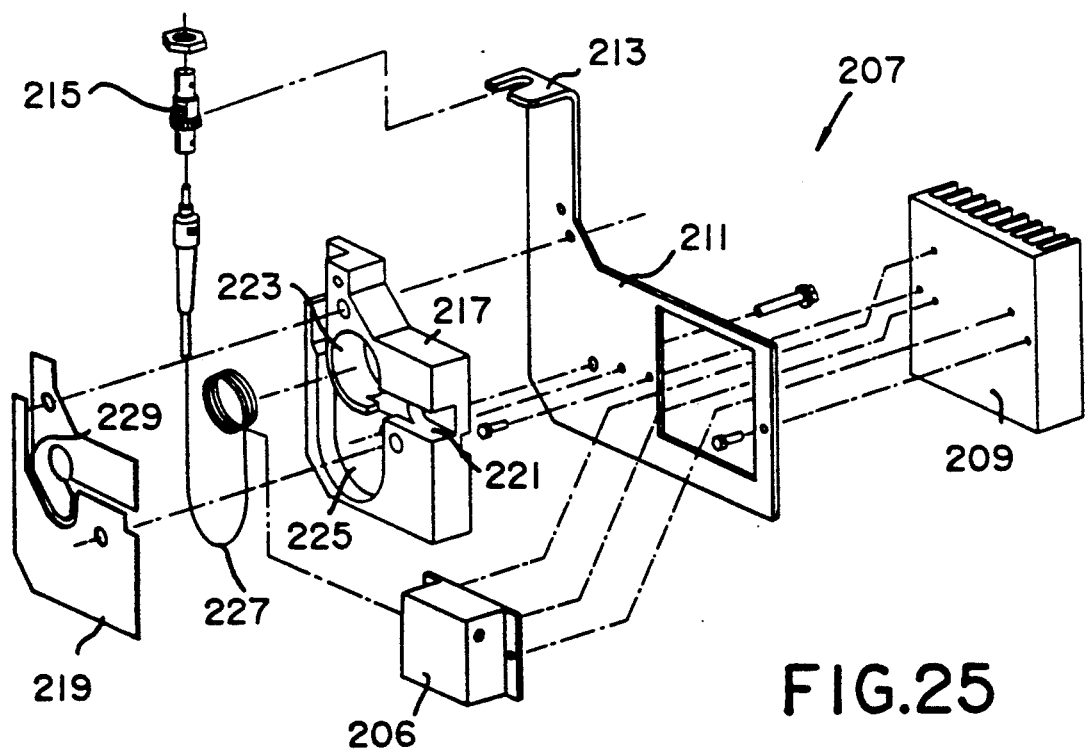
FIG. 25 is an exploded view of the laser mount and fiber guide shown in FIG. 24.

The diode lasers 206 are individually disposed in a unique mount 207 which is illustrated in both assembled and exploded form in FIGS. 24 and 25. The mount includes a heat sink 209 onto which the diode laser 206 is mounted. A bracket 211 is also mounted to the heat sink and includes a holder 213 for a fiber optic connector 215. An optical fiber guide and mode mixer 217 is also mounted on the bracket 211 and is held in place by a cover plate 219. The optical fiber guide and mode mixer 217 is formed either of a rigid molded plastic or an open cell foam plastic and is provided with an inlet channel 221, a cylindrical chamber 223, and an outlet chamber 225. The optical fiber 227 is connected to the laser diode 206 and enters the fiber guide 217 through the entry chamber 221. The fiber is wound in chamber 223 until substantially all the excess length thereof is accommodated and then the fiber is routed through exit chamber 225 so that the fiber connector 215 can be mounted rigidly in the holder portion 213 of bracket 211. The cover plate 219 is provided with a restricted access channel 229 therethrough which generally follows the path of the fiber in the fiber guide. With this construction, a substantial length of fiber may be wound into the cylindrical chamber 223, providing mode mixing for the light passing therethrough and accommodating variations in the length of the fiber between the laser diode and the outlet connector 215. Moreover, any odd length of fiber not accommodated by a full wrap within the cylindrical chamber 223 may be accommodated by the outlet chamber 225. The access channel 229 through the cover plate 219 permits the insertion or withdrawal of the fiber into or from the fiber guide without disassembly, but is sufficiently narrower than the chambers in the fiber guide that it retains the fiber in the guide unless the fiber is deliberately pulled through the access channel. Accordingly the present invention provides a compact laser diode and optical fiber mount and guide assembly wherein the fiber is guided and held relatively stationary while providing the mode mixing necessary to even out the light transmitted thereby, and at the same time accommodating a variable length of fiber with no modifications to the fiber necessary.

Figure 10:
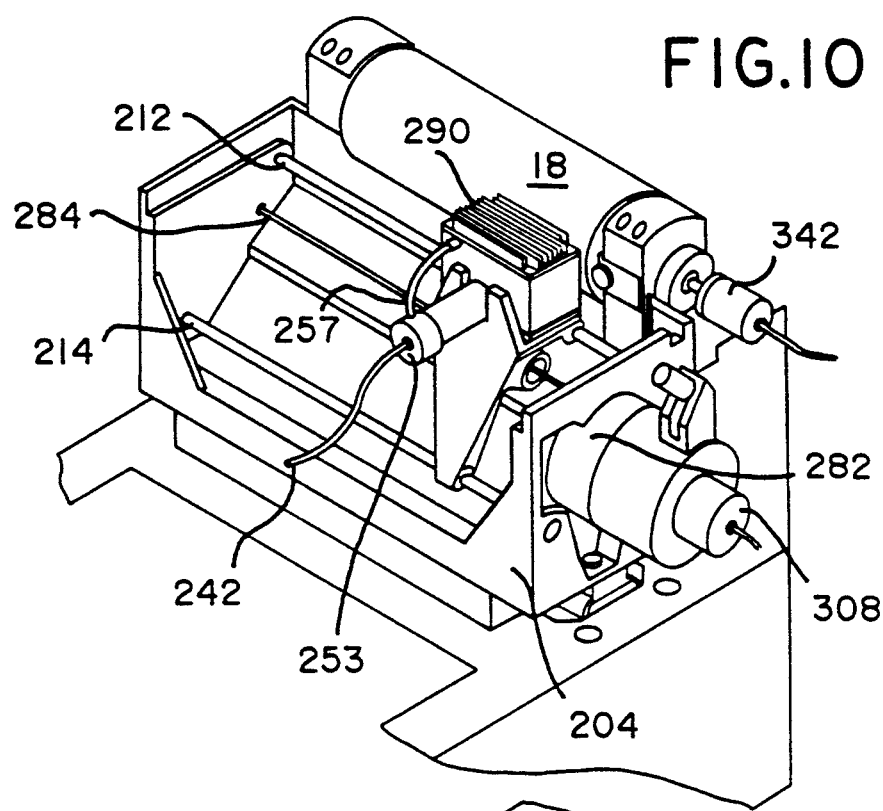
FIG. 10 is a rear perspective view of the imaging drum and the write head.

The focus detection system comprises a second array of optical fibers 271 mounted on the opposite surface of the substrate 238 with respect to the writing array 240. The focusing array 271 requires only a single fiber but, in practice, three fibers may be provided, with two as extras in case the first fiber fails. The focusing fiber is connected at its inlet end to a focusing laser diode, the housing 290 for which is mounted on the writehead assembly. In prior arrangements, the focusing laser diode was stationarily mounted remotely from the write head with the laser diodes for the writing array, and connected thereto by an optical fiber which permitted relative motion between the moving write head and the stationary laser diodes. However, it was found that the movement of the focusing optical fiber as the write head traversed the imaging drum generated sufficient noise in the light beam used for the focusing system, that the focus signal sensed by the photodetector was too variable to accurately control the focus of the writing array. It has been found that by mounting the focusing laser diode on the write head, with the optical fiber connecting the diode to the write head remaining substantially stationary despite the motion of the write head, that the clarity of the focus signal is significantly enhanced. The focusing diode housing 290 is not shown in FIG. 6 for the sake of clarity, but is illustrated in FIGS. 8, 9, and 10.

The focusing laser diode is selected to produce a second beam of light having a wavelength different from the wavelength of the writing beam and preferably outside the range of 800 nm–880 nm. Preferably, the focusing light source produces a beam of light having a predominant wavelength of 960 nm. It has been found that a focusing beam having a wavelength of 960 nm is substantially unabsorbed by all of the various donor dye materials. As a result, substantially all of the focusing beam of this wavelength will penetrate the donor material, regardless of the color dye employed, to be reflected from the reflective surface which is part of the receiver element. Inasmuch as this surface has been found to be much closer to the dye layer, where it is desirable to focus the writing beam, than the top surface of the donor layer, it is possible for both the writing beam and the focusing beam to be aimed at more nearly the same surface than is possible if the focusing beam is reflected from some other surface of the writing element. As a result, the writing beam may have less depth of focus and consequently may have a greater numerical aperture which permits the transmission of greater writing power to the writing element than would be the case were the focusing beam and the writing beam to be focused at more widely separated surfaces.

Figures 27, 28:
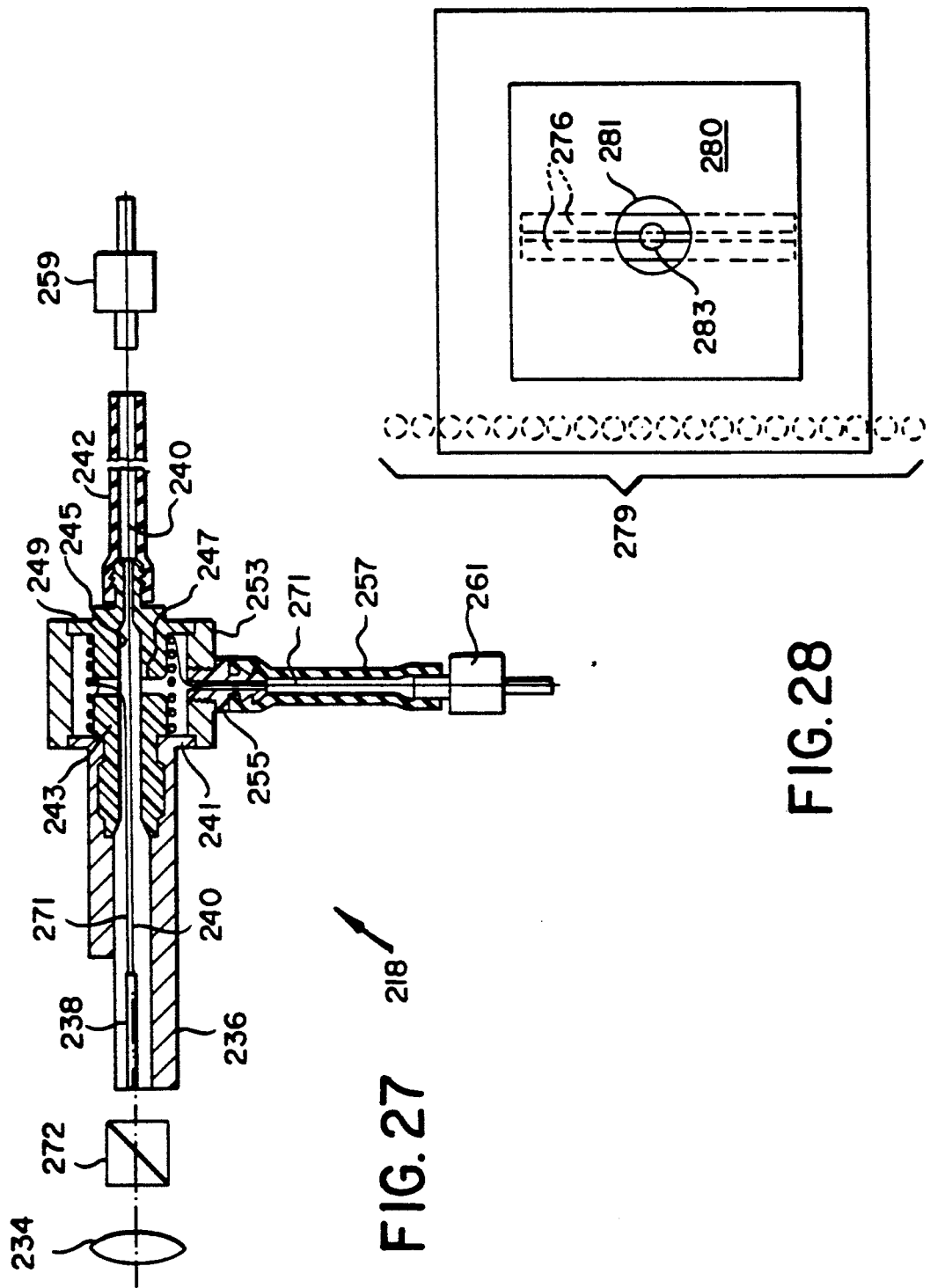
FIG. 27 is a cross section through the optical fiber spool for the focusing laser assembly mounted on the writehead.
FIG. 28 is a plan view of the focusing photodetector taken along line 28—28 of FIG. 7.

With the mounting of the focusing laser diode on the write head it has been necessary to provide an optical fiber spool to accommodate the length of the optical fiber connecting the focus diode to the write head array. This is necessary because a sufficiently long optical fiber must be provided for the focus diode that, after the one end of the fiber is mounted on the writing array substrate, the opposite end of the fiber may be polished for inclusion in an optical fiber coupling. Thus, the excess length of fiber must be accommodated without permitting motion of the fiber which can reintroduce undesirable noise into the focus signal. A focus fiber spool is illustrated in FIG. 27, and comprises a modification of the write head 218 illustrated in FIG. 7. The tubular member of the printhead assembly 236 is provided with an external flange 241 at the end opposite from the lens 234, and an internal thread to engage a fiber spool 243 which has an internal fiber bore 245, a cross bore 247 for the focus fiber 271, and an external flange 249 which is arranged to be spaced from the flange 241. A sleeve 253, having a nipple 255 arranged to mate with a focus fiber protective sheath 257, is disposed between and held by the two flanges 241 and 249. To assemble the spool, the writing fibers and the focus fiber are mounted on the substrate 238, and all of the fibers are routed through the bore of the printhead assembly 236. The focus fiber is then threaded into the bore 245 of the spool 243 and is fed out of the cross bore 247. The writing fibers are directed straight through the bore 245 of the spool, into the protective sheath 242 and to an optical fiber coupler 259. The focus fiber is then fed through the nipple 255 in the sleeve, through the protective sheath 257 to a coupler 261. The substrate is then mounted in the tubular member of the printhead assembly. The spool is then threaded into the end of the printhead assembly 236 with the sleeve held loosely between the flanges 241 and 249. The sleeve 253, with the focus fiber extending through the nipple 255, is rotated between the flanges, wrapping the excess focus fiber around the outer surface of the spool until the excess length is taken up. This wrapping action has no effect on the writing fibers since they are free of the spool and do not become twisted thereby. After all of the excess focus fiber has been wound on the spool, the spool is tightened in the printhead assembly, locking the sleeve in place. Thus the excess focus fiber is accommodated and prevented from moving and degrading the focus signal.

As illustrated in FIG. 7, the focus detection system also includes a beam splitter 272, having a semi-reflective buried surface 274, which is disposed between the writing end 239 of the linear array 240 and the stationary lens 234. A split cell photodetector 276 is disposed in the sidewall of barrel 228 and is arranged to receive the portion of the focusing beam which is reflected from the writing element and by the buried layer of the beam splitter. A knife edge 278 is provided between the beam splitter and the photodetector 276. It has been found that the quantity of light from the writing array reaching the photodetector, illustrated in phantom at 279 in FIG. 28, is sufficiently great that, despite the precautions noted above, it can overwhelm the focus signal at the photodetector. Accordingly, a micromask 280 is provided having an aperture 281 with a diameter in the range of 300 microns to 600 microns, and preferably having a diameter of about 400 microns. This mask significantly contributes to the ability of the system to prevent energy from the writing array from reaching the focusing photodetector. A mask having a thickness of approximately 400 microns, spaced from the surface of the photodetector a distance in the range of approximately 125 microns to 500 microns, and preferably at a distance of 400 microns, satisfactorily permits a reflected focus beam 283 with a diameter of about 50 microns to be utilized by the split-cell photodetector for controlling the focus of the writing head array in spite of the presence of the reflected portion of the writing array, consisting of twenty beams of approximately 50 microns in diameter originally each having a power twenty times that of the focusing beam, impinging on the face of the photodetector mount only one millimeter away.

Thus, the focus detection system comprises the laser diode producing a beam of light having a wavelength of 960 nm, a focusing optical fiber 271 which is disposed on the opposite of the mounting substrate from the linear array of the writing beam, and which is arranged to project the focusing beam through the beam splitter 272 and the focusing assembly comprising lenses 234 and 256, which are illustrated as single lenses but may comprise groups of simple or complex lenses. The focusing beam of light is then projected onto the drum surface, or the writing element disposed thereon, and is reflected from the reflective surface back through the focusing assembly and into the beam splitter 272 wherein a portion of the reflected focusing beam is deflected by the buried layer past the knife edge 278 and through the aperture 281 in the mask 280 onto the split cell photodetector 276. In the preferred embodiment, the photodetector 276 has a preferential wavelength sensitivity to the wavelength of the focusing beam, i.e. 960 nm. The signal from the photocell 276 is fed to a focusing circuit, not shown, which then generates an appropriate current which is supplied to the voice coil 262 on the bobbin 258 attached to the movable lens element 256. In this way the focus detection system constantly monitors the location of a surface closely adjacent the surface of the writing element on which the writing beam is to be concentrated.

It has been found that the initial coarse focus of the system can be facilitated by the use of the present focusing arrangement. It is necessary to approximate the final focus in the initial system set-up because it has been found that, without such an initial set-up, the writing array may be so far out of focus that the reflection of the writing beams from the surface of the writing element or from the imaging drum surface creates such a large, out-of-focus image at the focus photodetector that it will spill over into the focus beam area, flooding the focus beam photodetector to the extent that there would be no hope of establishing a true focus thereof. Accordingly, provision is made to operate the focus system alone, without operating the writing beam array, while defeating the operation of the voice coil drive to the auto-focus lens. Thus the installer of the writehead assembly initially sets the lens position by axially locating the barrel 228 in the translator 210 by reading the output of the split-cell photodetector 276 with a suitable measuring device such as an ocilloscope or a voltmeter. As the writehead assembly is moved toward the desired focal point, the output of the photodetector will rise to a maximum and then will fall through zero to a minimum. The desired focal setting for the initial focus of the writehead assembly and the auto-focus system is the point where the output crosses zero, and the assembly is clamped to the translator at that position.

IMAGING DRUM

Details of the imaging drum 18 and its drive are illustrated in FIGS. 12-15. The drum is generally hollow and comprises a cylindrical shell 320 which is provided with a plurality of vacuum perforations 322 therethrough. The ends of the drum are closed by cylindrical plates 324 and 326 each of which is provided with a centrally disposed hub, 328 and 330, which extend outwardly therefrom through support bearings 332 and 334, respectively, in the respective portions of the frame member 204. Hub member 328 extends through the bearing 332 and is stepped down to receive a motor armature 336 which is held on to the hub by a fastener nut 338. A motor stator 340 is stationarily held by the frame member 204, encircling the armature 336 to form a reversible, variable speed drive motor for the imaging drum. The outer end of hub 328 is connected to an encoder 342 which is supported from the frame member 204 and is coupled to the hub by means of a flexible coupling 344. The opposite hub 330 is provided with a central vacuum opening 346 that is in alignment with a vacuum pipe 348 which is provided with an external flange 350 that is rigidly connected to the outer surface of frame member 204. The vacuum pipe is provided with an extension 353 which extends within but is closely spaced from the internal surface 346 of hub 330. With this arrangement, a slight vacuum leakage channel is provided between the outer diameter of the vacuum pipe extension 353 and the inner diameter of the vacuum opening in the hub 330 which assures that no contact exists between these parts which might impart uneven movement or jitter to the imaging drum during its rotation. The opposite end of the vacuum pipe is connected to a high-volume vacuum pump which, in the preferred embodiment, is capable of generating a vacuum of 5014 60 inches of $H_2O$ at a volume of 60-70 cfm.

The outer surface of the imaging drum is provided with an axially extending "flat" 352 which extends approximately 8 degrees of the drum circumferance and includes the axial indicia line 268, substantially as illustrated in FIG. 13. The drum is also provided with a circumferential recess 354 which extends circumferentially of the drum from one side of the flat 352 around the drum to the other side of the flat, and from just outside the inner wall of end plate 326 to just outside the inner wall of end plate 324, substantially as illustrated in FIG. 12. The circumferential recess is exaggerated in the illustration since the depth thereof is substantially equal to the thickness of the receiver sheet which is to be seated therein, e.g. approximately 0.004 inches in thickness. The end plates are provided with circumferential grooves 356 which are in communication, for the most part, with the interior of the drum and act to provide vacuum to the circumferential ends of the drum surface. A view of the drum surface generated by the unrolling thereof is illustrated in FIG. 15, with the surface divided axially along the line 268 which is also the centerline of the surface flat 352. The opposite edges of the drum flat are illustrated at the dotted lines 352a. The axial edges of the recess 354 are illustrated at 354a. The area covered by the receiver sheet adhered to the imaging drum surface is indicated by dotted lines 358, which area extends axially almost from one side of the recess 354 to almost the other and circumferentially of the drum from one edge of the flat to the other, without overlapping it.

A valve block 360 is disposed axially along the inner surface of the drum substantially beneath the flat 352 on the outer surface thereof and provides two separately controllable vacuum chambers 362 and 364 beneath selected vacuum holes disposed on either side of the axial centerline 268 of the drum flat 352. The first chamber 362 extends along the plurality of vacuum openings disposed in the "leading edge" of the drum flat 352. The term "leading edge" refers to the portion of the drum flat onto which the leading edge of the donor material is disposed when it is superposed over the receiver sheet and the drum is spun in the normal writing direction as indicated by arrow 365 in FIG. 13. This chamber controls the hold-down of the leading end of the donor sheet, as will be more thoroughly described hereinbelow, and will be referred to as the "donor vacuum chamber" hereafter. The extent of the donor vacuum chamber 362 is illustrated by lines 362a in FIG. 15 and will be seen to extend into a portion of the chambers 356 which are provided along the circumferential edge of the drum. The second, separately controllable vacuum chamber 364 extends along the trailing edge of the receiver sheet when it is mounted on the drum, as indicated by dotted lines 364a in FIG. 15, and will be referred to as the "receiver vacuum chamber" hereafter. The imaging drum is also provided with a counterbalance block 366 opposite to the vacuum chamber block 360 in order to provide dynamic balance to the drum. Each of the balancing block 366 and valve block 360 are provided with passageways 370 which permit vacuum to be applied to vacuum holes that would otherwise be covered by the respective blocks and which are not intended to be controlled by the vacuum chambers 362 and 364. The area of the drum circumference covered by the donor sheet when it is superposed with the receiver sheet is indicated by lines 371 in FIG. 15. Further, a registration indicia 373 is disposed substantially axially centrally of the drum and centered over the center line 268 of the axial flat 352, the purpose of which will be described hereinbelow.

The purpose of the drum flat 352 is twofold; it assures that the leading and trailing ends of the donor sheets are somewhat protected from the effect of the air during the relatively high speed drum rotation during the writing process. Thus the air will have less tendency to lift the leading or trailing end of the donor sheets. The drum flat also assures that the leading and trailing end edges of the donor sheet are recessed from the drum periphery so that there is less chance that they can come into contact with other parts of the apparatus such as the end of the writing head and cause damage. The drum flat also acts to impart a bending force to the ends of the donor sheets when they are held to the drum surface by the vacuum within the drum so that, when that portion of the vacuum is turned off, that end of the donor sheet will tend to lift from the drum surface by the release of the bending force on the sheet. This is used to advantage in the removal of the donor sheet from the imaging drum, as will be described hereinbelow.

The purpose of the recess 354 in the imaging drum surface is to eliminate any creases in the donor sheets as they are drawn down over the receiver sheet during the loading of the donor sheet. This assures that no folds or creases will be generated in the donor sheet which could extend into the image area and seriously adversely affect the resulting image. The recess also substantially eliminates the entrainment of air along the edge of the receiver sheet where it is difficult for the vacuum holes in the drum surface to assure the removal of all the air. Any residual air between the receiver sheet and the donor sheet can also adversely affect the image.

CONTROLLED VACUUM CHAMBER AND CONTROL VALVE

Figure 14:
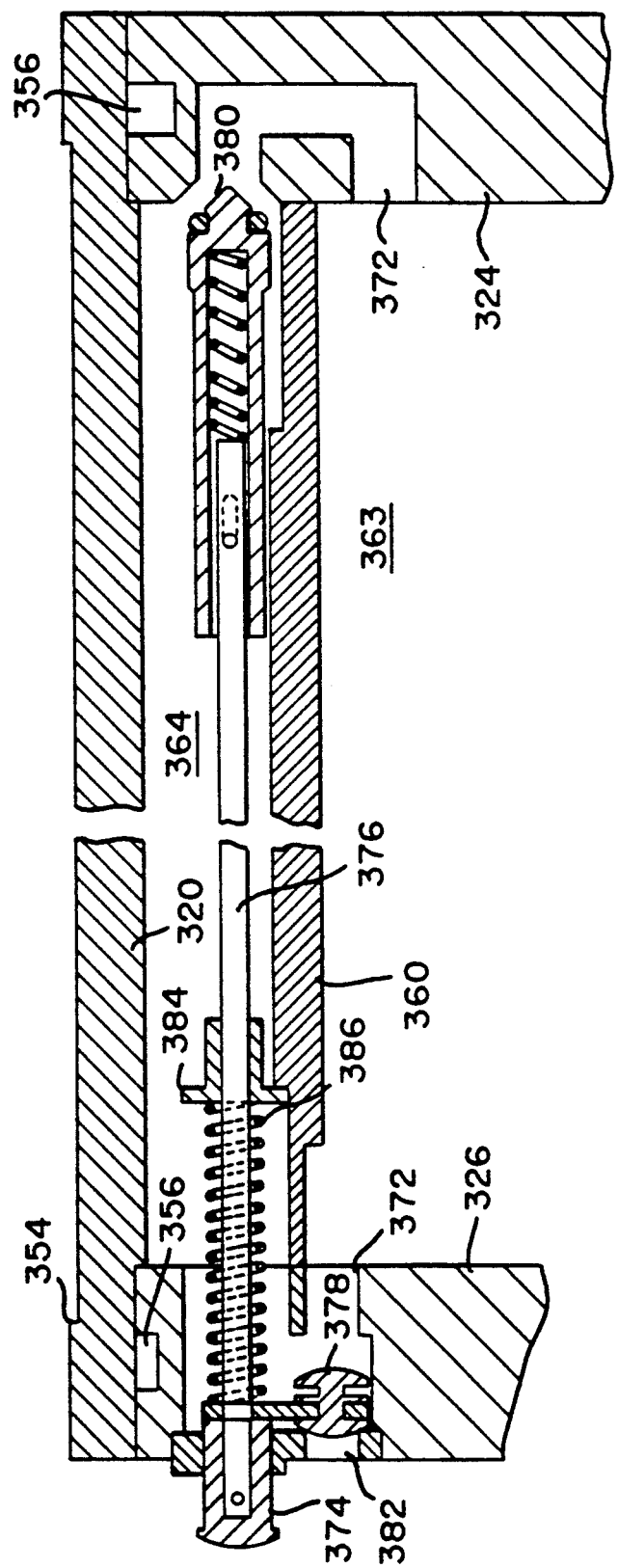
FIG. 14 is a cross sectional view of the receiver unload vacuum chamber taken along line 14—14 of FIG. 13 showing the details of the vacuum control valve.

An enlarged detail of a controlled vacuum chamber and the control valve therefor is illustrated in FIG. 14 wherein the receiver vacuum chamber 364 is illustrated. As illustrated, the vacuum chamber 364 communicates with the central interior vacuum chamber 363 of the drum via passageways 372 in each of the end plates 324 and 326. The control valve comprises a valve actuator 374 which extends outwardly from the end plate 326 and is arranged for engagment by an actuator cam 388 which is illustrated in FIGS. 16-19 and will be described more throughly hereinbelow. The valve actuator 374 is connected internally of the vacuum chamber via an elongated rod 376 to first and second valve members 378 and 380 at opposite ends of the valve chamber 364. Each of the valve members is arranged to mate with a cooperating seat which closes the respective passage 372, blocking the vacuum in the main drum chamber 363 from being transferred to the controlled vacuum chamber 364. At the same time that valve member 378 closes the passage 372, it also opens the valve chamber 364 to the atmosphere through opening 382 in the end wall 326 of the drum (see FIG. 17). Valve member 380 is spring loaded against the end of the rod 376 so that it can accommodate slight differences between the length of the rod and the length of the chamber. The rod 376 is provided with a spring retainer 384 which abuts a shoulder in the wall of the chamber 364 to load a spring 386 which returns the valve to the position where the chamber is open to the main vacuum chamber 363 when the valve actuator is released by the valve actuator cam 388 (see FIG. 18).

Figure 11:
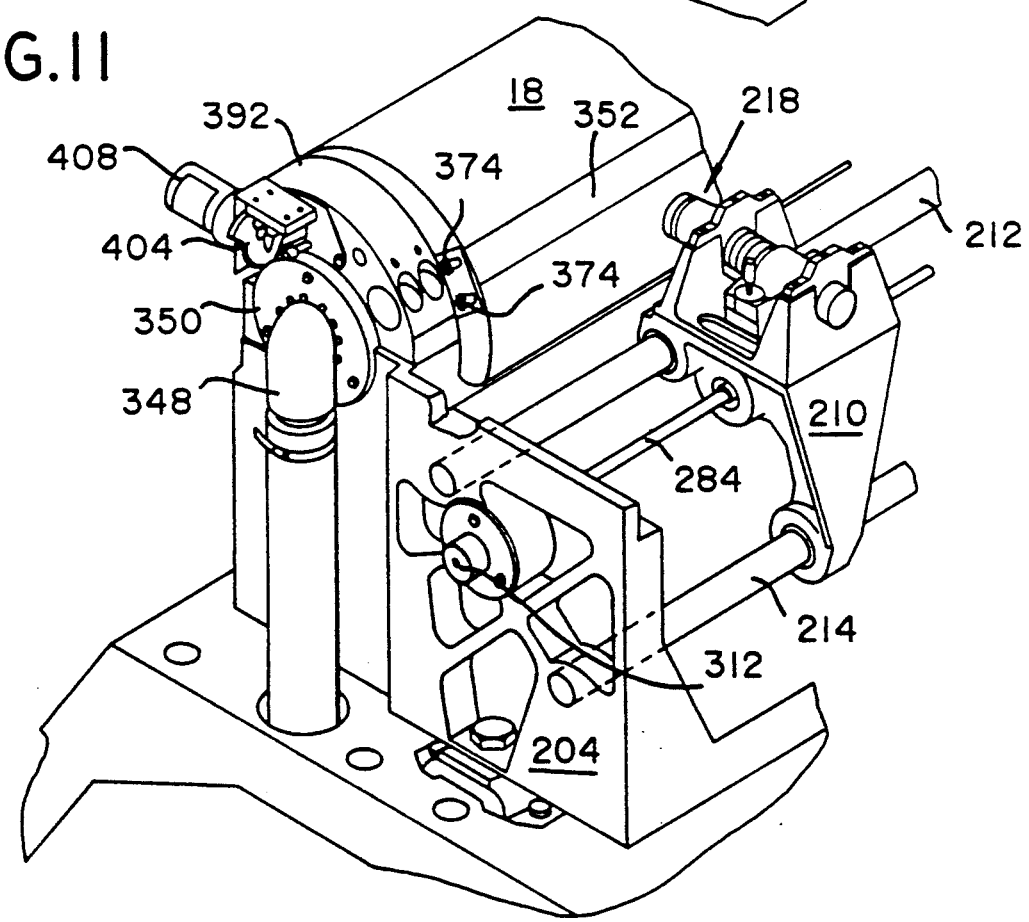
FIG. 11 is a partial rear perspective view of the imaging drum and the write head taken from the opposite end of the drum shown in FIG. 10.
Figure 18:
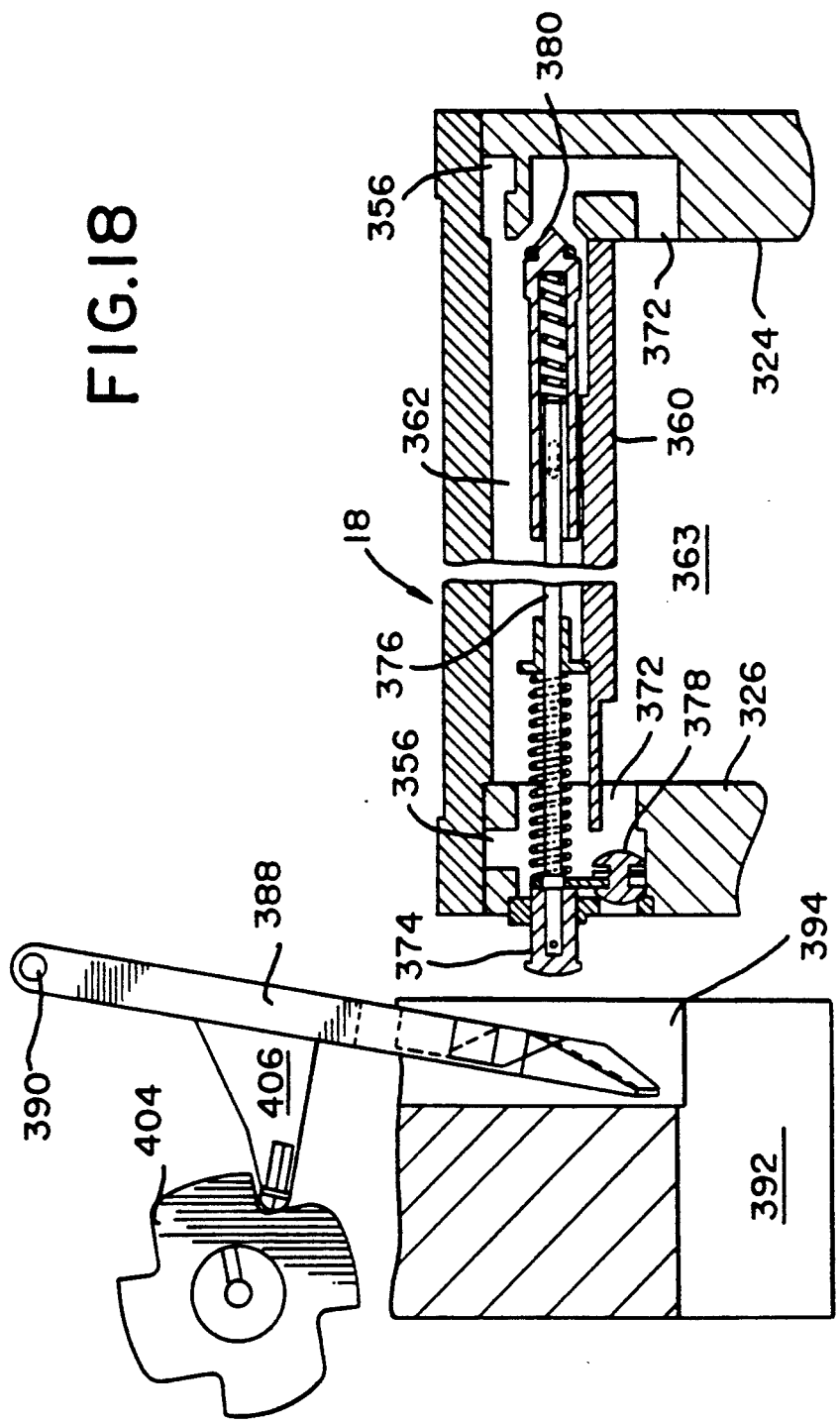
FIG. 18 is an illustration similar to FIG. 17 with the actuator cam disengaged from the vacuum control valve.

The vacuum chamber valve actuator cam 388 is illustrated in FIGS. 16-19 and comprises a generally vertically mounted planar member which is pivoted from a support, not shown, from its upper end about a pivot 390. The valve actuator cam is mounted from the bearing cap 392 at the vacuum supply end of the imaging drum as illustrated in FIG. 11. A portion of the bearing cap 392, partially in section, is illustrated in FIGS. 17 and 18 and is provided with a recess 394 in the face thereof facing the end of the drum 18 to receive the end of the valve actuating cam 388 when it is in its "at rest" position, as illustrated in FIG. 18. The face of the cam is provided with actuator surfaces 396 and 398 which are arranged to engage the actuators 374 of one or both of the controlled vacuum chambers 362 and 364. The cam face is also provided with a recess 400 that permits the cam to not operate the valve for the receiver chamber 364 during the operation of the valve for the donor chamber 362 at one stage of the operation, as described below. The cam is also provided with ramping surfaces 402 to prevent damage to the valve actuators should the drum be inadvertantly rotated while the actuator cam is in the operative position illustrated in FIG. 17. The actuator cam 388 is driven by means of a rotory cam 404 which engages a cam extention 406 on the back surface of actuator cam 388. The rotary cam 404 is mounted on a shaft and is driven by a motor 408, shown in FIG. 11, mounted on the outer surface of the bearing cap 392.

EXIT TRANSPORT

The waste sheet exit transport 22 comprises a donor stripper blade 410 disposed adjacent the upper surface of the imaging drum and movable between an unloading position wherein it is in contact with the sheets on the drum surface and an inoperative position wherein it is moved up and away from the surface of the drum. A driven waste transport belt 412 is arranged substantially horizontally to carry used donor sheets removed by the stripper blade 410 to an exit 414 from the machine.

The image sheet exit transport 24 comprises a stationary image exit blade 416 disposed adjacent the top surface of the imaging drum 18 substantially opposite from the movable stripper blade 410. An image sheet transfer belt 418 is arranged for cooperation with a vacuum table 420 to deliver a receiver sheet with an image formed thereon to an exit tray 422 in the exterior of the apparatus.

AIR FLOW

The location of the various elements within the apparatus cabinet 26 has been chosen so that, along with the airflow to be described below, the overall operation of the apparatus is enhanced. Specifically, the location of the material supply assembly 12 and the sheet cutter assembly 14 have been selected so that any dust introduced into the apparatus along with the material supply rolls, or generated by the sheet cutter are as remote as possible from the image writing location. It has been found that the quality of the image may be adversely affected if dust is permitted to come between the donor sheet and the receiver sheet when they are superposed on the imaging drum. Accordingly, since the sheet cutting assembly 14 is known as a dust and dirt generating site, it is placed in the lowermost location within the assembly cabinet. Further, an exhaust fan 82 is arranged to draw air in from the general cabinet area, through the cutter assembly 14 and to exhaust this potentially dirt-laden air through an exit 424 from the apparatus cabinet.

The apparatus cabinet is generally sealed against entry of air so that air may be introduced into the cabinet through an air inlet 426 via a very fine filter assembly 428 by means of a forced air fan 430. The air from this fan is conducted by a duct 432 and the flow is indicated generally by the open arrows in FIG. 26. A portion of the air is supplied to the air chamber 90 of the sheet transport assembly 16 and is controlled by the damper valve 93. A further portion of the air is generally directed over the sheet transport assembly. Further downstream air is ducted into the imaging assembly area where it passes over the imaging drum and the writehead assembly to be exhausted through the waste and image exits. The air at the imaging assembly area is at a high enough pressure compared to the other interior portions of the cabinet that it also flows from the imaging assembly area into the sheet transport assembly area to preclude any dirt carrying air from that area from entering the imaging area. The air from the sheet transport area is exhausted through the sheet cutter assembly by the exhaust fan 82, as noted above. Another portion of the air is directed at the circuit boards and other electronic components, generally indicated at 434, to cool these devices before it exits from the apparatus through an exit 436. A further portion of air is ducted to the laser diodes 206 to cool them before passing to an exit 438 from the apparatus.

Accordingly, it will be seen that with the present apparatus, the air flow therethrough is carefully controlled to minimize the possibility of dust and dirt being conducted into the imaging area and thus contaminating the sheet elements and adversely affecting the image generated therein. Moreover, the locations of the components supplying materials to the imaging station have been chosen to place the dirt and dust generators as far from the imaging area as possible, and to utilize gravity to further diminish the transfer of dirt to the imaging area. Still further, the use of an exhaust fan to exhausting air from the cabinet through the sheet cutter assembly also contributes to the cleanliness of the imaging area.

OPERATIONAL SEQUENCE

Referring now to FIGS. 19-23c, the operational sequence of the laser thermal printer proofer of the present invention will be described. The sequence step order is indicated at the beginning of each step as a number in a bracket [#] which also corresponds to the sequence number indicated in the chart illustrated in FIGS. 23a-23c. The drum centerline positions noted in FIGS. 23a-23c are illustrated schematically in FIG. 20. [1] With the imaging drum 18 located with the centerline 268 of the drum flat 352 located in the "Home" position, i.e. directly in line with the optical axis of the writehead assembly 218, the following is the status of the various components and assemblies of the apparatus: the carousel 30 is stationary, the imaging drum 18 is stationary, as are the metering roll 86 and the sheet transport rolls 102 and 104. No material is superposed on the imaging drum and the vacuum pump connected thereto is off. The squeegee roller 97 is disengaged from the imaging drum as is the donor stripper blade 410. To start, the carousel is rotated until the supply roll 44 of the receiver material is located adjacent the sheet cutter assembly 14. The carousel is stopped and the edge guide 96 is disposed in the first, receiver, position. The air to the air table 92 is turned off by closing the damper valve 93. The sheet feed roll 48 is driven by the drive 72, as previously described, feeding the end of the receiver web into the sheet cutter assembly where it is engaged by the metering roll 86 and belt 88 and advanced until the proper length of material is determined. The cutter blades 84 are actuated. The condition of the overall system at this point is illustrated in FIG. 22a.

Figure 22A:
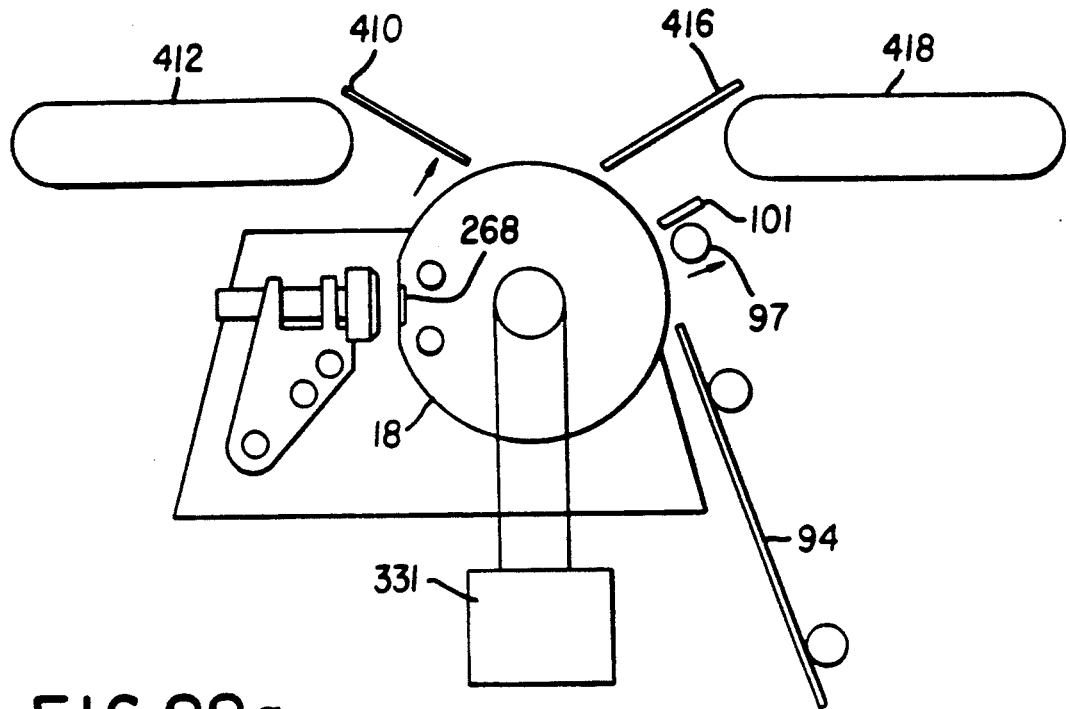
FIGS. 22a—22i are partial schematic illustrations of the material handling system at selected steps during the loading and unloading of material to and from the imaging drum.
Figure 22B:
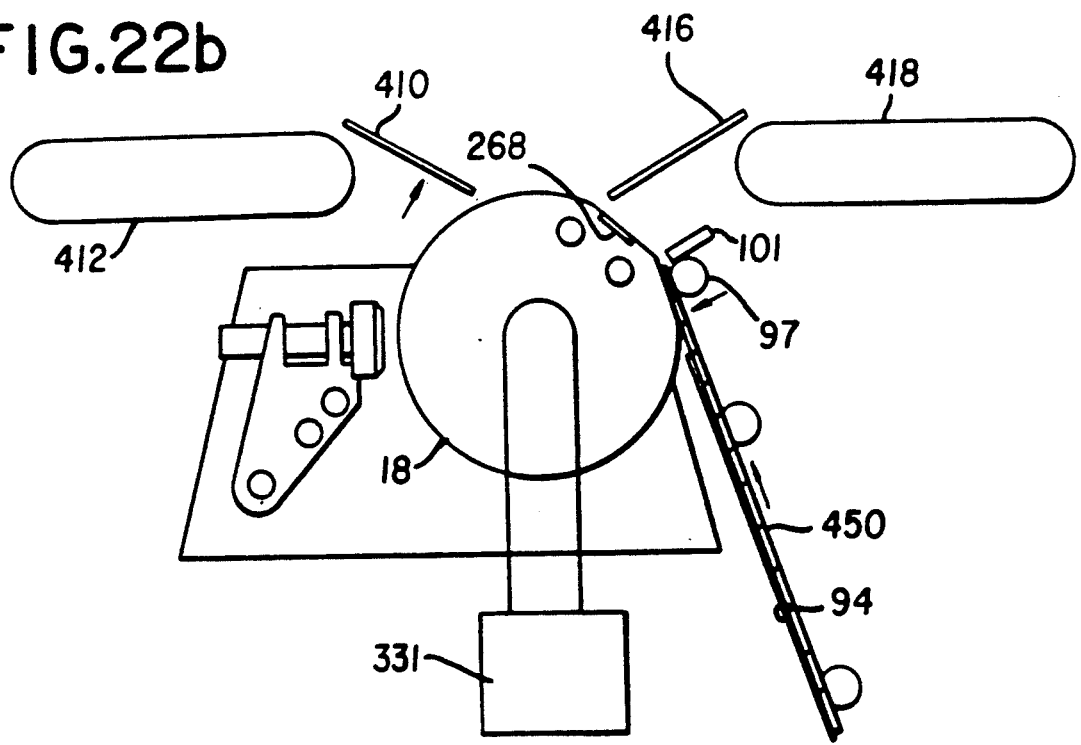
Figure 22C:
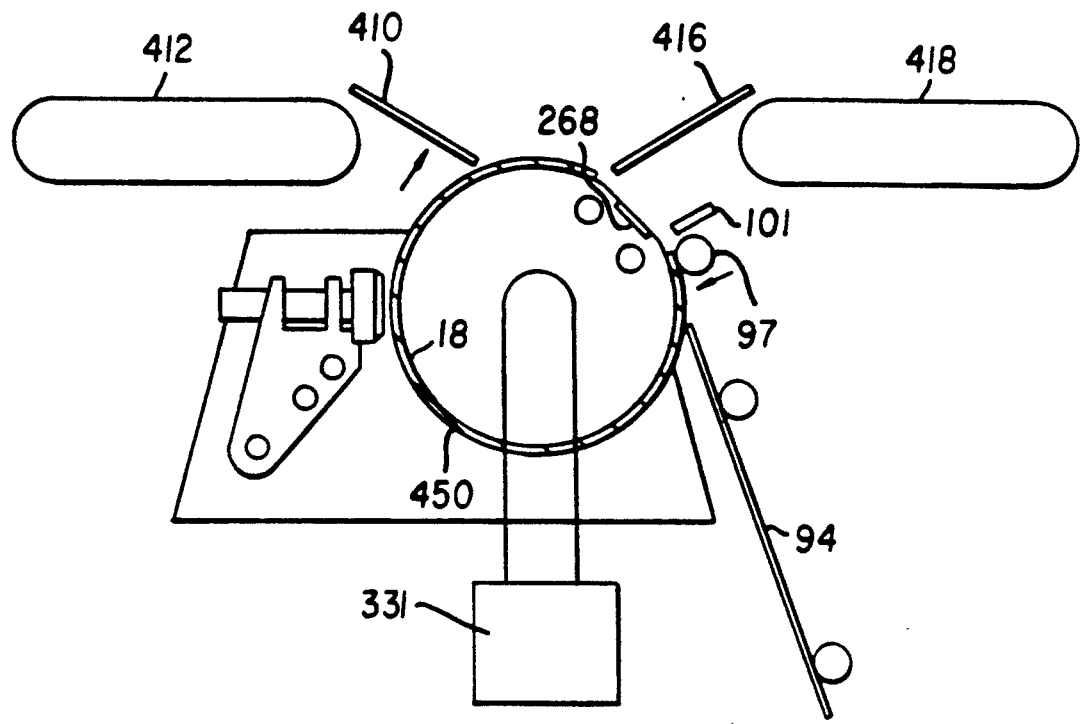

[2] The imaging drum is then rotated clockwise and is stopped with the centerline 268 of the drum flat 352 disposed under the sheet sensor 101 at position H (see FIGS. 20 and 23a-23c). All other conditions are the same as step 1. With the centerline 268 disposed at position H, the sheet sensor 101 does not see the non-reflective registration indicia 373 (see FIG. 15). [3] The sheet transport assembly 16 is then actuated and the receiver sheet is driven up until the leading edge thereof is sensed by the sheet sensor 101 and the transport assembly drive rollers and the sheet are stopped. As the receiver sheet is driven into engagement with the drum, the sheet sensor detects the lead edge of the sheet by seeing the reflection from the surface of the sheet and stops the sheet with the edge at the sheet sensor 101 centerline at position A. [4] The imaging drum is then rotated counterclockwise to the receiver load position "B" (see FIG. 20) and is stopped. [5] The vacuum to the imaging drum is then actuated by actuating the vacuum pump. All of the vacuum chambers in the imaging drum are supplied with vacuum at this point, as indicated in FIG. 21a wherein all of the vacuum openings are supplied with vacuum. [6] The load or squeegee roller 97 is moved into engagement with the end of the receiver sheet, pressing it into contact with the imaging drum where the vacuum operates to hold it to the drum surface. The condition of the overall system at this point is illustrated in FIG. 22b. [7] The imaging drum is then rotated counterclockwise until the trailing edge of the receiver sheet is under the squeegee roller 97. The squeegee roller acts to facilitate the removal of all of the air from between the receiver sheet and the drum surface. [8] The imaging drum is then rotated clockwise until the lead edge of the receiver sheet is again beneath the squeegee roller 97. The air to the air table 92 is turned on by opening the damper valve 93. The condition of the overall system at this point is illustrated in FIG. 22c. [9] The load roller 97 is moved to the disengaged position, spaced from the surface of the imaging drum.

Figure 19A:
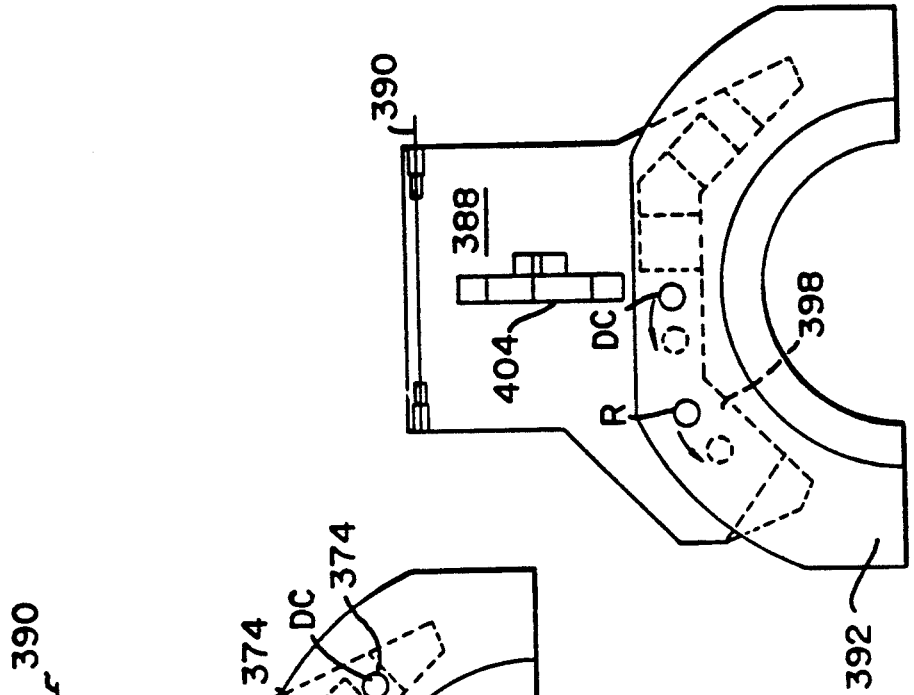
FIGS. 19a—19c are elevation views of the actuator cam taken along line 19—19 of FIG. 17 illustrating the relative positions of the cam followers of the respective vacuum control valves for different functions.

[10] The carousel is rotated and stopped at the appropriate donor supply location, and the edge guide 96 is moved to the second, donor position so the donor sheet will properly overlap the receiver sheet when the donor sheet is superposed therewithon the imaging drum. The sheet feed roll 48 is driven by the drive 72, as previously described, feeding the end of the donor web into the sheet cutter assembly where it is engaged by the metering roll 86 and belt 88 and advanced until the proper length is reached. The cutter blades 89 are actuated to cut a donor sheet from the donor web. The imaging drum is rotated clockwise to the donor sheet loading position "H". [11] The valve actuator cam 388 is actuated by motor 408 operating through the cam 404 to move the valve actuator cam into the operative position illustrated in FIGS. 17 and 19a, whereby the cam surface 396 engages the valve actuator 374 "DC" for the donor chamber 362, closing the passages 372, turning off the vacuum to that chamber and opening it to atmospheric pressure. This is necessary at this point because, since the receiver sheet has previously been superposed on the majority of the drum surface, closing off the majority of the vacuum openings therethrough, the vacuum now available at the lead edge of the donor sheet is sufficiently strong that it might prevent the movement of the sheet over the drum surface were that portion of the vacuum holes not be isolated from the vacuum. Referring to FIG. 19a, it is seen that the valve actuator 374 "R" for the receiver chamber 364 is located in the recess 400 of the valve actuator cam 388 and is not acted upon thereby. This condition of the vacuum chambers is illustrated in FIG. 21b wherein the donor vacuum chamber 362 is crosshatched to indicate that no vacuum is being applied thereto, but the remainder of the vacuum holes are supplied with vacuum.

Figure 22D:
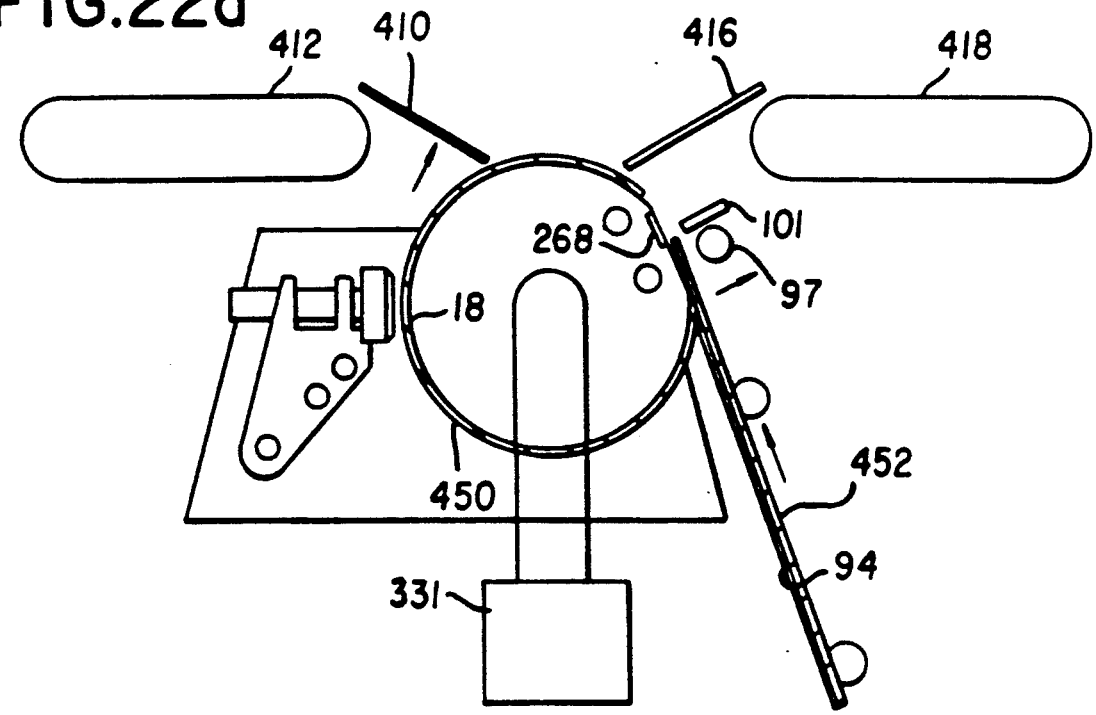
Figure 22E:
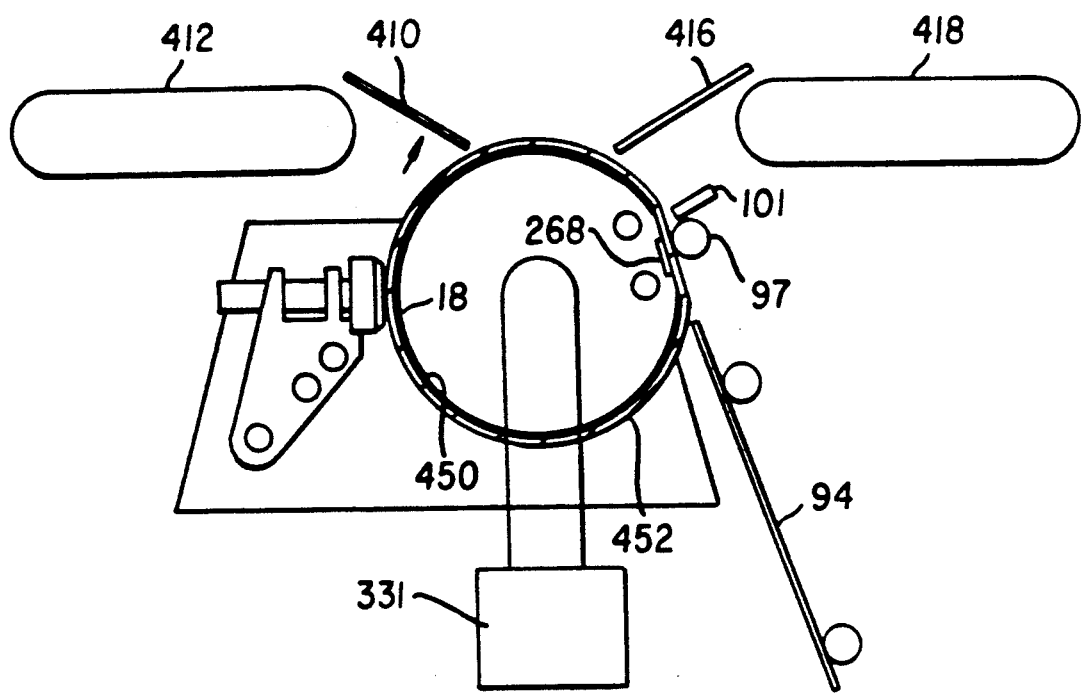

[12] The donor sheet, which has previously been fed from the appropriate supply roll on the carousel, cut and supplied to the sheet transport assembly is now located on the sheet transport assembly 16 and is driven upward and stopped with the leading edge of the donor sheet at the sheet sensor 101. The sheet sensor 101 has previously checked the location of the receiver sheet to assure that it does not overlie the registration indicia 373 and, if it does, to generate a fault signal to stop the sequence. The sensor now senses the lead edge of the donor sheet to assure that it overlies the proper area of the registration indicia as indicated in FIG. 15. The condition of the overall system at this point is illustrated in FIG. 22d. [13] The valve actuation cam 388 is then disengaged, releasing the donor vacuum chamber valve to reapply vacuum to the donor vacuum chamber 362 and thus to the leading edge of the donor sheet. [14] The loading squeegee roller 97 is then moved to the engaged position forcing the donor sheet into engagement with the drum flat 352. [15] The imaging drum is rotated counterclockwise until the trailing edge of the donor sheet is under the squeegee roller. The condition of the overall system at this point is illustrated in FIG. 22e. [16] The imaging drum is reversed and rotated clockwise until the leading edge of the donor sheet is again under the load roller. It has been found that without reversing the imaging drum and re-rolling the donor sheet into contact with the receiver sheet that, although it appears that all air has been removed from between the sheets that some air can still remain before the second pass of the squeegee roller. Such entrained air is unnoticed until the image has been formed when areas of low density are found to have occurred because of entrained air. With the second pass of the squeegee roller pressing the donor sheet into contact with the receiver sheet, such unnoticed entrained air is eliminated. At this point the sheet sensor again checks for the proper positioning of the donor sheet and, if the trailing end edge of the donor sheet overlies the proper area of the registration indicia, indicates both that the donor sheet is properly located and that it is of the proper length. If the sensor detects the non-reflective registration indicia when it should sense the donor surface, an error signal is generated, interrupting the sequence. [17] The squeegee roller is disengaged from the imaging drum and the imaging drum is accelerated in the counterclockwise direction to the image writing speed. At this time the imaging drum and the writehead translator are sychronized by means of the encoders associated with each drive and the imaging process commences.

Figure 19B:
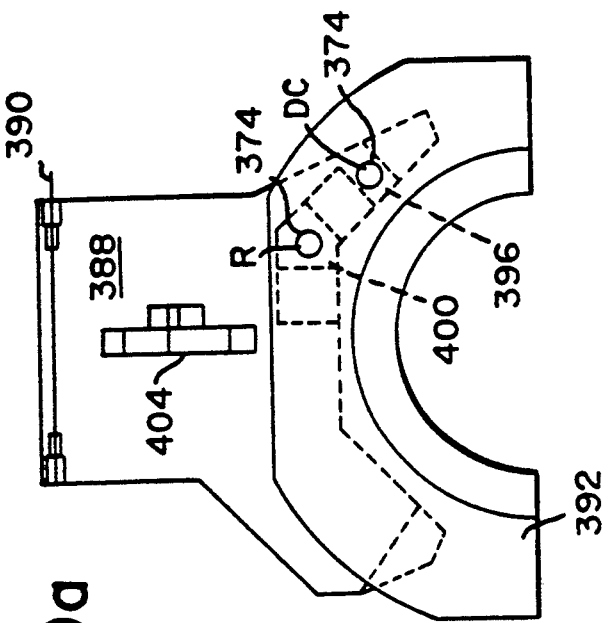
Figure 19C:
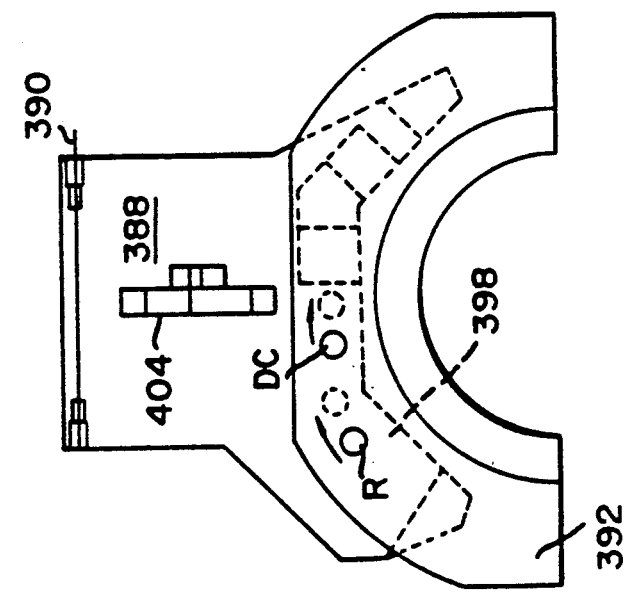
Figure 20:
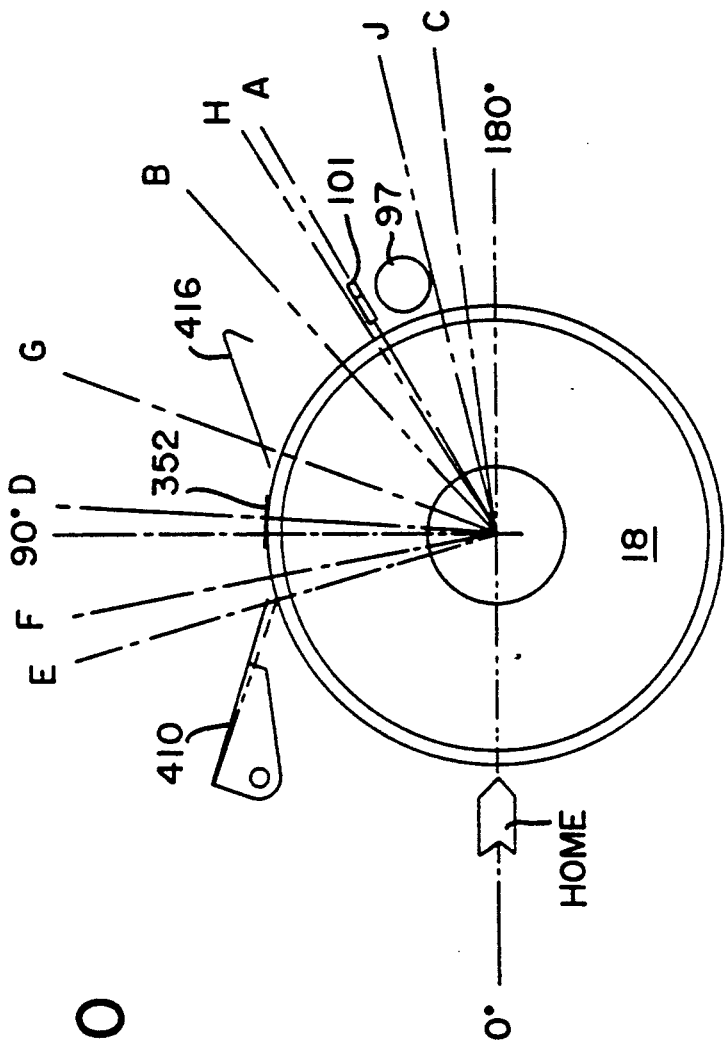
FIG. 20 is a schematic end view of the imaging drum illustrating the various operating positions thereof.
Figure 22F:
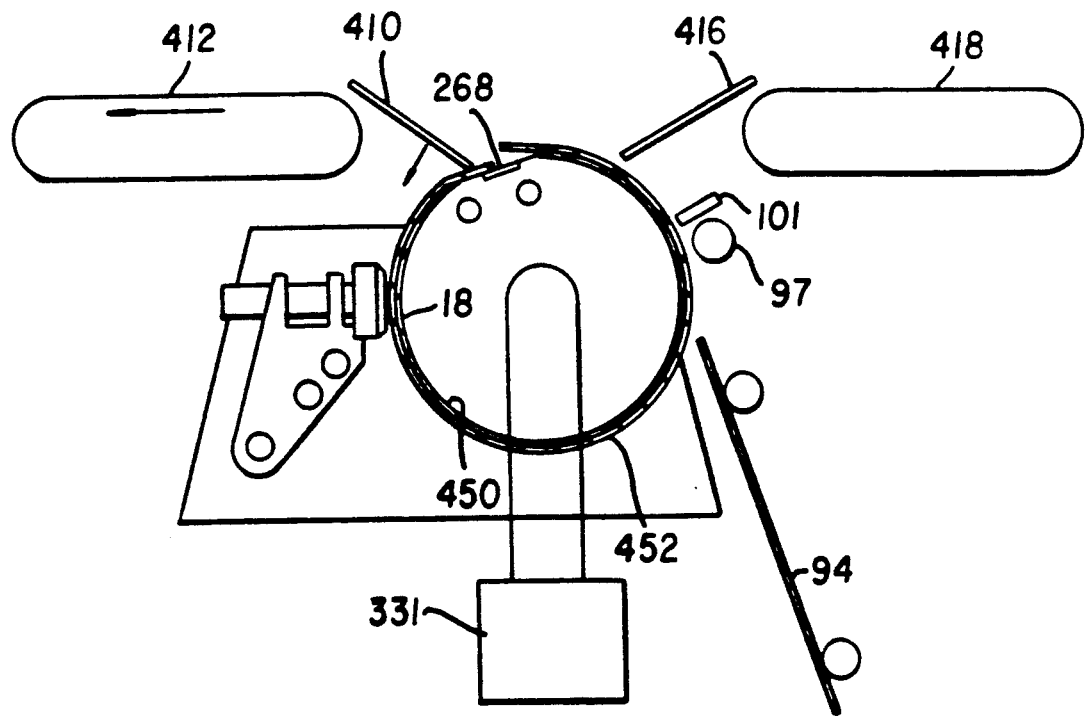
Figure 22G:
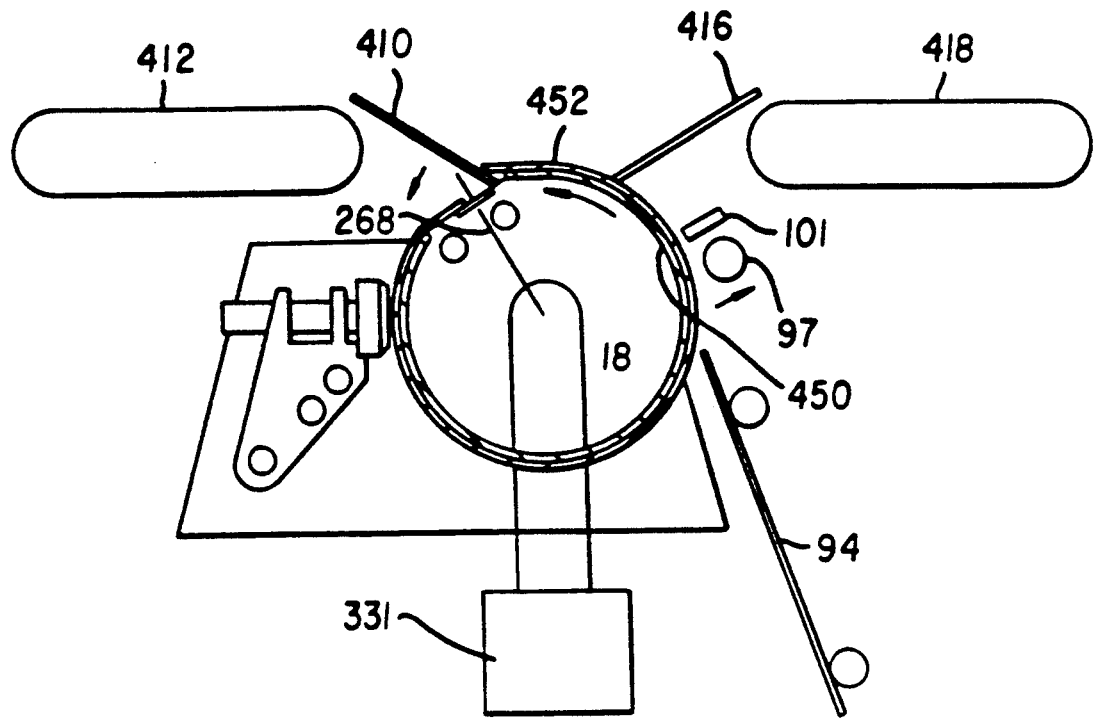

After the image has been written onto the receiver sheet from the first donor sheet, the first donor sheet must be removed from superposition with the receiver sheet without moving the receiver from its location on the imaging drum surface, since the registration of the multipass image is determined by assuring that the position of the receiver sheet remains the same for the multiple writing steps. As a result, it is important that the donor sheet be removed without disturbing the receiver sheet. This is accomplished by the following sequence of steps: [21] The imaging drum is stopped at the donor unload position indicated by position "F" in FIG. 20. [22] The donor stripper blade 410 is actuated to the position against the imaging drum surface. [23] The vacuum chamber valve actuator cam 388 is actuated to engage the valve actuators to both the donor vacuum chamber 362 and the receiver vacuum chamber 364. The location of the valve actuators with respect to the actuator cam surface 398 is illustrated in FIG. 19b along with the location of the valve actuators as they are moved toward the following step. The condition of the vacuum chambers is illustrated in FIG. 21c wherein both chambers 362 and 364 are open to atmosphere, as indicated by the shaded portion. At this point, since the vacuum under the leading edge of the donor sheet has been turned off, and since this portion of the donor sheet has been wrapped around the leading edge of the drum flat, the beam strength of the sheet material tends to lift the leading edge of the donor sheet from the drum flat as illustrated in FIG. 22f. It will be appreciated that, although the vacuum to the trailing edge of the receiver sheet has also been turned off, the trailing edge of the receiver sheet will not lift away from the surface of the imaging drum because it is still held by the superposed trailing edge of the donor sheet which overlies the trailing edge of the receiver sheet and is held by the vacuum holes in the trailing edge of the drum flat which are still being supplied with vacuum. Both valve actuators are actuated at this time primarily to simplify the vacuum actuator cam geometry, and because no disadvantage is encurred thereby. [24] The imaging drum is now rotated counterclockwise until approximately ¼ inch of the leading edge of the donor sheet, which has raised up away from the flat on the surface of the imaging drum, engages the donor stripper blade, substantially as illustrated in FIG. 22g. [25] The donor stripper blade is then moved to its disengaged position, with the leading edge of the donor sheet supported thereon. The donor exit drive belt 412 is energized at this point. [26] The valve actuator cam is moved to its inoperative position, illustrated in FIG. 18, reapplying vacuum to all of the vacuum chambers in the drum. [27] The imaging drum is rotated counterclockwise to completely strip the donor sheet from superposition with the receiver sheet and to drive it to the waste exit 414 of the apparatus.

The imaging drum is now ready for the superposition of the next donor sheet with the receiver material already registered thereon and containing a first image recorded from the first donor sheet. The second donor is then loaded onto the imaging drum by repeating steps [9-17] from the above loading sequence, and the next image is written onto the receiver. That donor is then removed according to the foregoing unloading sequence of steps [21-27]. This sequence continues, utilizing as many donor material sheets as the operator or program calls for. The apparatus is then ready to unload the receiver sheet bearing the finished image.

Figure 22H:
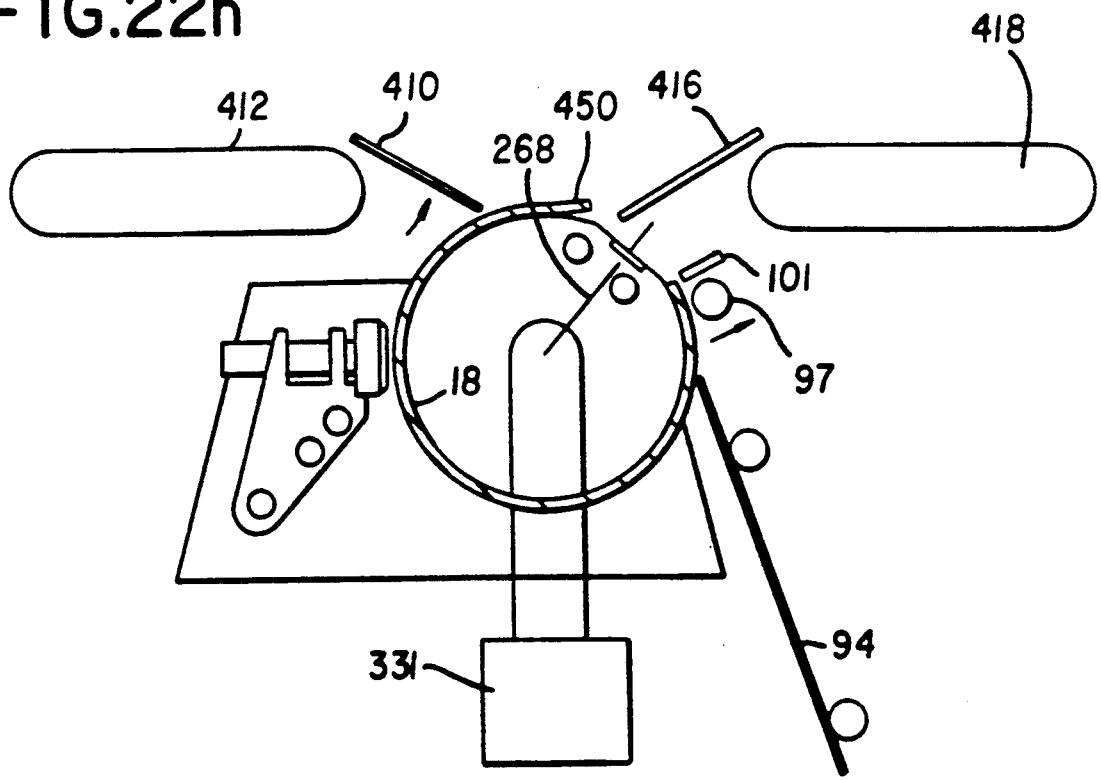
Figure 22I:
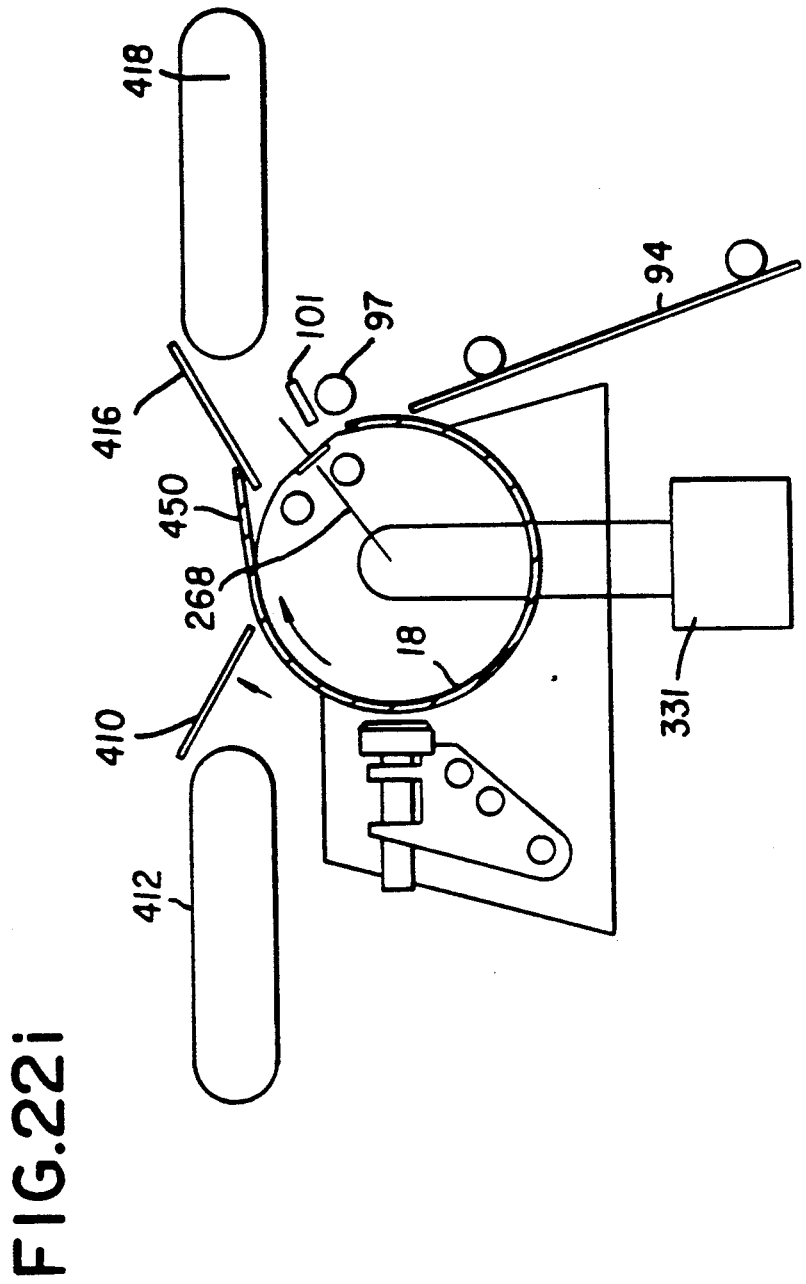

To unload the finished receiver, the following sequence is employed: [31] The imaging drum is stopped at the receiver unload position "D". [32] The valve actuator cam 388 is actuated engaging both of the valve actuators 374 for vacuum chambers 362 and 364. This releases the trailing end of the receiver sheet, which is no longer held down by a superposed donor sheet, and the receiver exit transport belt 418 and vacuum 420 are activated. The condition of the overall system at this point is illustrated in FIG. 22h. [33] The imaging drum is rotated clockwise until the trailing end edge of the receiver sheet is engaged by and lifted from the drum by the receiver sheet exit guide 416. The condition of the overall system at this point is illustrated in FIG. 22i. [34] The valve actuators are disengaged by deactivating the valve actuating cam 388, permitting vacuum to be reapplied to all of the drum. [35] The drum is rotated clockwise driving the receiver sheet onto the receiver sheet exit guide onto the receiver exit transport belt 418. Even though the vacuum has been reapplied to the imaging drum, inasmuch as the receiver sheet is being peeled from the surface of the drum by the receiver sheet exit guide, the number of vacuum holes open to the atmosphere is progressively increasing as the receiver sheet is removed, so that less and less vacuum hold down is provided to the receiver sheet remaining on the imaging drum, with only an amount of vacuum remaining sufficient to retain the "leading" end of the receiver sheet in position until the drum has rotated sufficiently that the entire receiver sheet has been removed therefrom. The finished receiver sheet is exited from the machine to be used or laminated to a paper stock for use as a proof. [36] The imaging drum is then rotated counterclockwise to the "Home" position, the vacuum is turned off and the apparatus is ready to generate the next proof.

It will be understood that should nonusable leader material be provided for either the receiver material supply roll or the donor supply rolls, it will be initially discarded by being cut from the lead end of the supply rolls and transported out of the apparatus via the waste exit transport 412.

Alternative Embodiments

While the preferred embodiment has been described with respect to apparatus that employs a rotating imaging drum, many of the features and advantages thereof can be incorporated in a method and apparatus employing a driven platen to carry the superposed receiver and donor materials. While certain preferred operating conditions and ranges have been set forth above, it will be understood that the apparatus can use other operating conditions and ranges. For example, the writing laser diodes may operate with a variable power range of 160-500 mw each, at wavelengths in the range of 800-880 nm. The writing beam may have a spot size at the writing plane of 18-30 um, generated by optical fibers having a diameter in the range of 50-62 um. The imaging drum can write at a resolution in the range of 1200-2400 dpi at speeds of 250-1200 rpm.

While the preferred embodiment sets forth that the focusing beam preferentially has a wavelength of 960 nm, it will be appreciated that alternative wavelengths may be chosen so long as they are sufficiently different from the predominent wavelength of the writing beam as to be readily distinguishable therefrom. Moreover, these alternative light beam wavelengths may or may not be relatively unabsorbed by the dye layers, so long as a sufficient amount can be detected at the photodetector to operate the focus detection system, and the absorption of the focusing light is insufficient to transfer dye from the donor to the receiver.

A further alternative to the preferred embodiment may be found in the surface chosen from which to reflect the focus beam. While the reflective surface of the receiver element is preferred, it is possible to reflect the focus beam from the surface of the drum member, particularly if the receiver element is transparent, or if the drum surface is particularly reflective. Still further, other surfaces of the writing element may be chosen as the surface from which to reflect the focus beam.

Additional variations in the present invention relate to the placement of the photo detector. For example it may be located outside, but adjacent the writing head so that the reflected portion of the focusing beam need not pass through the focusing assembly. Further, it is possible to locate the photodetector behind a transparent surface of the support member so that it responds to the direct impingement of the focusing beam without requiring any reflection thereof.

Accordingly, the present invention provides a method and apparatus for consistently, quickly and accurately generating an image utilizing such a thermal imaging process to create high quality, accurate, and consistent proof images, which method and apparatus is substantially automated to improve the control, quality and productivity of the proofing process while minimizing the attendance and labor necessary. Moreover, the writing apparatus is capable of not only generating this high quality image consistently, but is capable of creating a multi-color image which is in registration regardless of how the various individual images are supplied to the element comprising the final image. Thus, the present invention provides both a method and apparatus in which the various donor material sheets are sequentially superposed with a single receiver sheet and then removed without disturbing the receiver sheet on the writing drum or platen, maintaining the receiver sheet in one position during the entire writing process to assure the necessary registration of the multiple superposed images that create the final proof.

The invention has been described in detail with particular reference to a presently preferred embodiment, but it will be understood that variations and modifications can be effected within the spirit and scope of the invention.

We claim:

1. Thermal imaging apparatus comprising a horizontal imaging drum member mounted for rotation about its axis and arranged to mount a receiver member and a donor member in superposed relationship thereon, a plurality of modulated coherent light beam generators, an optical system for projecting said light beams as a line inclined at an angle to the axis of said drum member onto said donor member mounted on said drum member to transfer an image onto said receiver member by the transference of a dye from said donor member, a reversible drum drive for reversibly rotating said drum member, a translator drive for moving said optical system axially of said drum member, a sheet supply device for selectively supplying a receiver member and a plurality of donor members to said drum member, said sheet supply device arranged to supply a plurality of donor sheets sequentially to be individually superposed and imaged on a single receiver sheet, said receiver member having a first width and said donor members having a second width greater than that of said receiver member, a sheet registration mechanism for selectively registering said different sheets axially along the length of said imaging drum member, a loading roller selectively engageable with the surface of said imaging drum member to engage said donor sheets and to smooth them into engagement with the surface of said receiver sheet on said imaging drum member, a first sheet deflector operable to engage an end edge of a donor sheet to remove said donor sheet and remove it from superposition with said receiver sheet when said imaging drum member is rotated in a first direction without moving said receiver sheet, and a second sheet deflector operable to engage an end edge of a receiver sheet to remove said receiver sheet from said drum member when it is rotated in a second direction.

2. A thermal imaging apparatus according to claim 1 including a vacuum supply pump for supplying vacuum to the surface of said drum member for adhering said sheets thereto.

3. A thermal imaging apparatus according to claim 2 including a valve to release the vacuum to said drum surface to release the sheets therefrom.

* * * * *